United States Patent [19]
Tanoi

[11] Patent Number: 5,821,777
[45] Date of Patent: Oct. 13, 1998

[54] CURRENT AMPLIFIER AND DATA BUS CIRCUIT

[75] Inventor: Satoru Tanoi, Tokyo, Japan

[73] Assignee: Oki Electric Industry Co., Ltd., Tokyo, Japan

[21] Appl. No.: 678,858

[22] Filed: Jul. 12, 1996

[30] Foreign Application Priority Data

Jul. 14, 1995 [JP] Japan .................................. 7-179168

[51] Int. Cl.$^6$ ....................... H03K 19/00; H03K 19/0175
[52] U.S. Cl. ................................ 326/56; 326/57; 326/82; 326/83
[58] Field of Search ................................. 326/56, 57, 82, 326/83

[56] References Cited

U.S. PATENT DOCUMENTS

| | | | |
|---|---|---|---|
| 5,239,508 | 8/1993 | Nomura et al. | 365/189.09 |
| 5,264,743 | 11/1993 | Nakagome et al. | 326/56 |
| 5,353,249 | 10/1994 | Itano | 365/189.09 |
| 5,365,488 | 11/1994 | Matsushita et al. | 365/226 |

OTHER PUBLICATIONS

"VLSI Memory" by K. Ito, pp. 170–173, published by Baifukan, Japan.

Primary Examiner—David C. Nelms
Assistant Examiner—Trong Phan
Attorney, Agent, or Firm—Rabin & Champagne, P.C.

[57] ABSTRACT

There is provided a current amplifier and a data bus circuit using such a current amplifier capable of reducing input impedance with a smaller circuit area than the conventional so that high-speed operation of the data bus lines can be realized without a remarkable increase of the circuit area. The current amplifier includes first and second field effect transistors N11, N12 respectively provided between a pair of input terminals I, Ib and a first potential supply terminal Vcc, and third and fourth field effect transistors N13, N14 for supplying output power to a pair of output terminals O, Ob. The gate of the third field effect transistor is connected to the first input terminal and to the source of the first field effect transistor the gate of which is connected to the drain of the third field effect transistor, whereas the gate of the fourth field effect transistor is connected to the second input terminal and to the source of the second field effect transistor the gate of which is connected to the drain of the fourth field effect transistor.

42 Claims, 13 Drawing Sheets

PAMP52

CURRENT AMPLIFIER AND DATA BUS CIRCUIT

REFERENCE TO RELATED APPLICATION

This application claims the priority right under 35 U.S.C. §119, of Japanese Patent Application No. Hei 07-179168 on Jul. 14, 1995, the entire disclosure of which is incorporated herein by reference.

BACKGROUND OF THE INVENTION

1. Field of the Invention

This invention relates to a current amplifier and a data bus circuit using such current amplifiers and, more particularly, to a readout data bus circuit suitably used in a DRAM.

2. Description of Related Art

FIG. 1 shows a general structure of a conventional readout data bus circuit in a DRAM (a part of which is common to the present invention).

In FIG. 1, a plurality of memory cell arrays MCA are each provided with plural pairs of bit lines BL, BLb extending therefrom. Each pair of the bit lines BL, BLb is connected through a sense amplifier SA and a data transfer circuit 20 to a pair of sub data bus lines SDB, SDBb assigned to its own memory cell array NCA. Such pairs of sub data bus lines SDB, SDBb assigned to the respective memory cell arrays MCA are commonly connected to a pair of local data bus lines LDB, LDBb through respective current preamplifiers PAMP20 each provided with its own level regulating circuit PP20. The pair of local data bus lines LDB, LDBb is then connected through a main amplifier MAM20 to output terminals OUT, OUTb, respectively.

In operation, a column decoder/driver YDEC selects one data transfer circuit out of the plurality of data transfer circuits 20 commonly connected to each pair of sub data bus lines SDB, SDBb, so that the selected transfer circuit turns to be on-state. The column decoder/driver YDEC also selects, in accordance with an X address or Y address, one current preamplifier corresponding to the currently activated memory cell array MCA out of the plurality of current preamaplifiers PAMP20, so that the selected current preamplifier is turned on.

FIG. 2 shows an inner structure of the conventional data transfer circuit 20 and main amplifier MAMP20; FIG. 3 shows an inner structure of the conventional current preamplifier PAMP20 and level regulating circuit PP20.

Each data transfer circuit 20 includes a pair of NMOS transistors N21, N22 with the gates connected to the pair of bit lines BL, BLb, respectively, and the sources grounded. Further, an NMOS transistor N24 is connected in series between the NMOS transistor N21 and the sub data bus line SDB; an NMOS transistor N23 is connected in series between the NMOS transistor N22 and the sub data line SDBb. The gates of the NMOS transistors N23 and N24 are controlled by the column decoder/driver YDEC through a readout column line RCL coupled to the YDEC.

When the readout column line RCL becomes a high level (hereinafter, referred as H level) so that the NMOS transistors N23 and N24 turn to be on-state, the NMOS transistors N21 and N22 pull in current from corresponding sub data lines SDB and SDBb, respectively, in accordance with a voltage pair of the bit line pair BL, BLb amplified by the sense amplifier SA.

The main amplifier MAMP20 can be constituted of pull-up elements EPU, RPUb connected to the pair of local data bus lines LDB, LDBb, respectively, and a current-mirror type voltage amplifier VAMP. In other words, the main amplifier MAMP20 amplifies current pair flown from the local data bus line pair LDB, LDBb to corresponding one of the current preamplifiers PAMP20 (PAMP20i, PAMP20j, . . . ), and to convert it into a differential voltage to be output to the output terminal pair OUT, OUTb.

The conventional current preamplifier PAMP20 includes a pair of input terminals I, Ib, a pair of output terminals 0, Ob, and five NMOS transistors N25–N29. The input terminal I is connected to the gate of the NMOS transistor N27 and to the source of the NMOS transistor N25, whereas the input terminal Ib is connected to the gate of the NMOS transistor N28 and to the source of the NMOS transistor N26. The drains of the NMOS transistors N27 and N28 are connected to the output terminals Ob and O, respectively. On the other hand, the sources of the NMOS transistors N27 and N28 are commonly connected to the drain of the NMOS transistor N29 with the gate connected to a control line SE (SEi, SEj, . . . ) and the source connected to the ground line. Further, the gates and drains of the NMOS transistors N25, N26 are commonly connected to a power-supply voltage terminal Vcc.

The NMOS transistors N25 and N26 connected such above act as resistors equivalent to each other, so that a gate voltage is applied to the NMOS transistors N27, N28 in accordance with the current frown from the current preamplifier PAMP20 to the data transfer circuit 20 through the sub data bus lines SDB, SDBb. Consequently, the control line SE coupled to the column decoder/driver YDEC becomes the H level, so that the NMOS transistors N27, N28 pull in current, in accordance with the gate voltage, from the local data bus lines LDB and LDBb when the corresponding current preamplifier PAMP20 has been selected. In other words, the current passing through the sub data bus line pair SDB, SDBb is amplified and transmitted to the local data bus line pair LDB, LDBb.

The level regulating circuit PP20 stabilizes the potential on the sub data bus line pair SDB, SDBb. The level regulating circuit PP20 shown herein includes pull-down elements PD, PDb acting as a biasing circuit or precharging circuit, with each element PD, PDb connected to the corresponding one of the sub data bus lines SDB, SDBb. In other words, the level regulating circuit PP20 prevents the NMOS transistors N25 and N26 from turning to be cut-off state due to an excessive potential rise of the sub data bus line pair SDB, SDBb.

Next, a description will be made in brief to operational characteristics of the conventional current preamplifier PAMP20 that performs current amplification.

In the following equations, vI is a potential of a small signal at the input terminal I, iI is a current of an input small signal passing through the input terminal I in a direction shown by the arrow, and iob is a current of an output small signal passing through the output terminal ob. To simplify the description, ON resistance of the NMOS transistor N29 is assumed to be low enough.

Roughly speaking, an input impedance Zinp of the current preamplifier PAMP20 depends oft only the operation of the NMOS transistor N25,, so that the following equation (1,1) can be formed. On the other hand, a current gain Aip is the value of a ratio between the current iob of the output small signal, determined by only the operation of the NMOS transistor N27, and the current iI of the input small signal, determined by only the operation of the NMOS transistor N25, so that the following equation (1,2) can be formed.

$$Zinp = vI/iI = 1/g_{mpull} \qquad (1,1)$$

$$Aip = iob/i1 = g_{mN}/g_{mpull} = g_{mN} \cdot Zinp \quad (1,2)$$

Where $g_{mpull}$ is a mutual conductance of the NMOS transistors N25 and N26 and $g_{mN}$ is a mutual conductance of the NMOS transistors N27 and N28.

As apparent from the equation (1,2), the conventional current preamplifier PAMP20 amplifies minute changes in current on the sub data bus lines SDB, SDBb and transmits them to the local data bus lines LDBb, LDB for performing readout operation.

However,, such current preamplifier and data bus circuit involve problems as follows.

(1) Since the sub data line pair SDB, SDBb having large parasitic capacity is required to reduce the voltage amplitude for high-speed readout operation, the input impedance of the current preamplifier PAMP20 must be reduced.

In order to reduce the input impedance of the conventional current preamplifier PAMP20, it is necessary to enlarge the gate width of the transistors N25, N26 that supply current to the sub data bus line pair SDB, SDBb. Accordingly, a problem arises that the circuit occupied area becomes large.

In Recent tendency of DRAM design, where the DRAM is divided into large numbers of memory cell arrays and associated data lines for high-speed operation, since a number of current preamplifiers PAMP20 are implanted between memory arrays for each divided pair of the data lines, an increase of the area occupied by the current preamplifier PAMP20 results in a shape increase in the chip size.

Document 1, "VLSI Memory," K. Ito, page 170–173, published by Baifukan, Japan, teaches structure and operation of a current-sensing main amplifier which uses two current-mirror type voltage differential amplifiers to provide a negative feedback so that the input impedance can be reduced. It is therefore considered to use such a current-sensing main amplifier as the current preamplifier PAMP20 to be provided in positions shown in FIG. 1.

However,, the current-mirror type voltage differential amplifier disclosed in the document 1 needs five or more MOS transistors, as seen on page 274, so that the current-sensing amplifier using two current-mirror type voltage differential amplifiers necessitates 12 MOS transistors in total. It is therefore inconvenient for the current amplifier implanted in a small area between memory cell arrays because a large number of elements are needed.

(2) As discussed above, the input impedance of the current preamplifier need to be reduced for high-speed operation. However, when the input impedance Zinp is reduced, for example, to ½, the current gain Aip also becomes ½, as apparent from the equation (½), thereby reducing the performance to drive the local data bus line pair LDBb, LDB connected to the output terminal pair of the current preamplifier. As a result, another problem arises that adequately high-speed operation can not be obtained.

(3) In the conventional data bus circuit, when a current preamplifier PAMP20 connected at a distant end with the main amplifier MAMP20 is selected, a voltage drop of the local data bus line pair LDB, LDBb occurs due to the parasitic resistance. Consequently, the drain-to-source voltage of the NMOS transistors N27, N28, with the gates connected to the sub data bus line pair SDB, SDBb, are reduced. These transistors can turn to be non-saturating state according to conditions, so that the current gain of the current preamplifier PAMP20 is abruptly reduced, thereby slowing down the operation.

As described above, the conventional current preamplifier and data bus circuit using the same involve the problems as follows: (1) it is necessary to provide a large area for the circuit so that the input impedance of the current preamplifier can be reduced, (2) reduction in input impedance of the current preamplifier makes the current gain small, so that adequately high-speed operation can not be obtained, and (3) the current gain of the current preamplifier is reduced due to a voltage drop of the local data bus line pair by the parasitic resistance thereof since the local data bus line pair is driven by the current preamplifier, thereby slowing down the operation.

Therefore, it has been required to provide a current amplifier capable of reducing the input impedance, the number of elements and the circuit area; a current amplifier capable of reducing the input impedance but making the current gain large; and a data bus circuit capable of reducing the influence of a voltage drop produced by parasitic resistance of data bus lines.

SUMMARY OF THE INVENTION

A current amplifier according to a first aspect of the present invention includes first and second field effect transistors respectively provided between a pair of input terminals and a first potential supply terminal, and third and fourth field effect transistors for supplying output power to a pair of output terminals.

In such a current amplifier, the gate of the third field effect transistor is connected to the first input terminal and to the source of the first field effect transistor with the gate connected to the drain of the third field effect transistor, whereas the gate of the fourth field effect transistor is connected to the second input terminal and to the source of the second field effect transistor with the gate connected to the drain of the fourth field effect transistor.

A current amplifier according to a second aspect of the present invention includes first and second field effect transistors each for supplying current to corresponding one of a pair of input terminals, and third and fourth field effect transistors with the gates connected to the pair of input terminals, respectively.

In such a current amplifier, the drain of the third field effect transistor, the gate of the first field effect transistor and the drain of the second field effect transistor are connected to a second output terminal, whereas the drain of the fourth field effect transistor, the gate of the second field effect transistor and the drain of the first field effect transistor are connected to a first output terminal.

A data bus circuit according to a third aspect of the present invention includes a plurality of first current amplifiers each using a pair of first data bus lines as its input line pair, part or all of which are connected to a pair of second data bus lines through their own output terminal pairs, and a second current amplifier using the pair of second data bus lines as its input line pair.

The second current amplifier is constituted with a low input impedance circuit having a pair of field effect transistors each connected to corresponding one of the pair of second data bus lines so that the conductance thereof is controlled by the potential on the data bus line. As the first current amplifier, either of the current amplifiers according to the first and second aspects of the present invention is used.

A data bus circuit according to a fourth aspect of the present invention includes a current amplifier constituted with an arrangement according to the first or second aspect of the present invention, and a level regulating circuit connected to a pair of input data bus lines for the current amplifier.

The level regulating circuit includes a pair of field effect transistors with the gates biased to a predetermined potential and the sources controlled in accordance with the activated or deactivated state of the current amplifier.

According to the first aspect of the present invention, the current amplifier includes the first to fourth field effect transistors as connected such above, so that the input impedance of the current amplifier can be reduced with a smaller circuit area than the conventional since a negative feedback is provided to the current amplifier, thereby accelerating operation of the data bus lines without a remarkable increase of the circuit area.

According to the second aspect of the present invention, the current amplifier includes the first to fourth field effect transistors as connected such above, so that the current amplifier can be realized with a smaller occupied area having a lower impedance and a lager current gain than the conventional, thereby accelerating data transmission from input data bus lines to output data bus lines.

According to the third aspect of the present invention, the data bus circuit includes a plurality of first current amplifiers each using the pair of first data bus lines as its input line pair, part or all of which are connected to the pair of second data bus lines through their own output terminal pairs, and the second current amplifier using the pair of second data bus lines as its input line pair, in which the second current amplifier is constituted with a low input impedance circuit and the first current amplifier is made up with an arrangement according to the first or second aspect of the present invention. Accordingly, high-speed data transmission between the first and second current amplifiers can be realized independently of the physical position of selected first current amplifier.

According to the fourth aspect of the present invention, the data bus circuit includes the level regulating circuit, connected to the input data bus line pair for the current amplifier, having the pair of field effect transistors with the gates biased to a predetermined potential and the sources controlled in accordance with the activated or deactivated state of the current amplifier, so that the logical level of the input data bus line pair for the current amplifier can be optimized in accordance with the activated or deactivated state of the current amplifier.

BRIEF DESCRIPTION OF DRAWINGS

The above and other features of the invention are apparent to those skilled in the art from the following preferred embodiments thereof when considered in conjunction with the accompanied drawings, in which.

Figure 1:
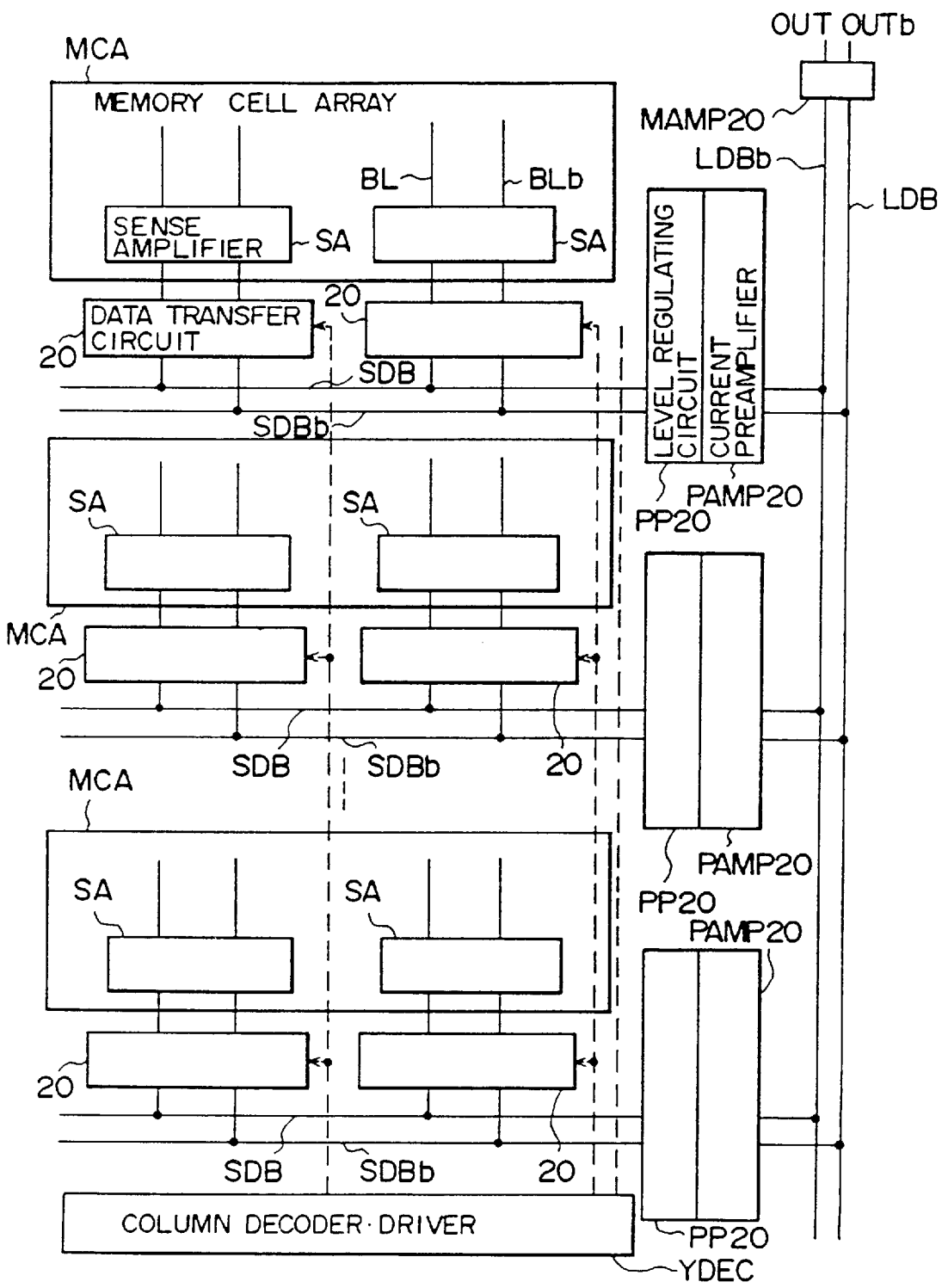
FIG. 1 is a block diagram showing a typical data bus circuit in a DRAM.

DETAILED DESCRIPTION OF THE PREFERRED EMBODIMENTS (A) First Embodiment

Referring to the drawing, a description will be made in detail to a data bus circuit according to a first embodiment of the present invention.

(A-1) Structure

Figure 4:
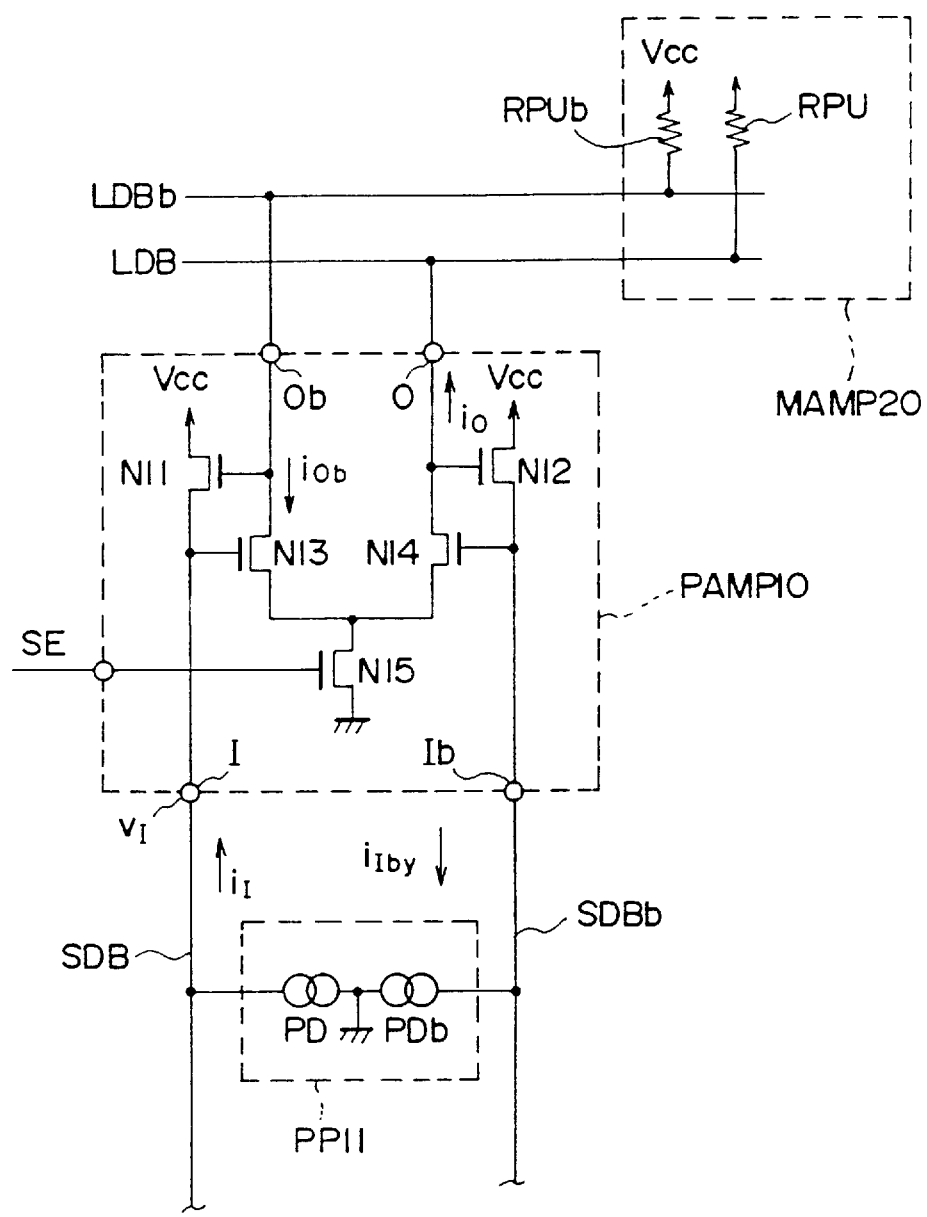
FIG. 4 is a circuit diagram showing part of a data bus circuit including a current preamplifier according to a first embodiment of the present invention.

FIG. 4 is a circuit diagram showing the main part of the data bus circuit with a current preamplifier PAMP10 according to the first embodiment.

The current preamplifier PAMP10 in the first embodiment features a pair of MOS transistors for supplying current to the input terminal pair, with the gates controlled by potential at the output terminal pair.

The current preamplifier PAMP10 includes a pair of input terminals I, Ib, a pair of output terminals O, Ob, and five NMOS transistors N11–N15.

The input terminal I is connected to the gate of the NMOS transistor N13 and to the source of the NMOS transistor N11 with the drain connected to the power-supply voltage terminal Vcc. On the other hand, the input terminal Ib is connected to the gate of the NMOS transistor N14 and to the source of the NMOS transistor N12 with the drain connected to the power-supply voltage terminal Vcc. The drain of the NMOS N13 is connected to the gate of the NMOS N11 and to the output terminal Ob, whereas the drain of the NMOS transistor N14 is connected to the gate of the NMOS transistor N12 and to the output terminal O. The sources of the NMOS transistors N13 and N14 are commonly connected to the drain of the NMOS transistor N15 with the gate connected to a control line SE and the source connected to a ground line.

As similar to the conventional, a level regulating circuit PP11 is connected to the pair of sub data lines SDB, SDBb, for example,, which includes pull-down elements PD, PDb, and the pair of local data bus lines LDB, LDBb is biased to be a high potential by pull-up elements RPU, RPUb in the main amplifier MAMP20. The pull-down elements PD, PDb in the level regulating circuit PP11 can be NMOS transistors with the gates connected to a predetermined control line and the sources grounded.

(A-2) Operation

Generally, the logic operation of the data bus circuit using the current preamplifiers PAMP10 according to the first embodiment is the same as that of the conventional. Accordingly, a description will be made below to electrical characteristics and operation of the current preamplifier PAMP10 with the general description of the logic operation omitted.

In the current preamplifier PAMP10, the gates of the NMOS transistors N11, N12 each for supplying current to corresponding one of the data bus lines SDB, SDBb are coupled to the output terminals Ob, O, respectively, so that negative feedback is provided to the preamplifier.

For example, when a current iI flown from the input terminal I is reduced so that the potential at the input terminal I rises, a current iob passing through the NMOS transistor N13 increases to drop the potential at the output terminal Ob due to a voltage drop produced by parasitic resistance on the local data bus line LDBb and the pull-up element RPUb in the main amplifier MAMP20 connected to the local data bus line LDBb. Consequently, the drain-to-source conductance of the NMOS transistor N11 is reduced to prevent the potential rise at the input terminal I.

In other words, the NMOS transistor pairs N11, N13 and N12, N14 act as negative feedback amplifying circuits, respectively.

It should be noted that such a negative feedback action becomes effective when the H level exhibiting the selected state of the corresponding current preamplifier PAMP10 is applied to the control line SE and the NMOS transistor N15 turns to be on-state.

Thus, the conductance of the NNOS transistors N11, N12 for pulling up the sub data bus lines SDB, SDBb is regulated by potential changes at the output terminals Ob, O, so that not only output currents iob, io can be changed to be large enough with respect to changes in the input currents iI, iIb, but also the input impedance can be reduced.

Next, the following equations are used to explain small signal characteristics of the current preamplifier in further detail.

In the following equations, vI is a voltage of a small signal at the input terminal I, Vob is a voltage of the small signal at the output terminal Ob, iI is a current of the small signal supplied to the input terminal I, and iob is a current supplied to the output terminal Ob. Further, r is an input impedance of the main amplifier MAMP20 transferred from the output terminal of the current preamplifier PAMP10 through the local data bus line, i.e., an impedance on the local data bus line. Then, a mutual conductance of the NMOS transistors N11, N12 is expressed by $g_{mpu11N}$, a mutual conductance of the NMOS transistors N13, N14 is expressed by $g_{mN}$. To simplify the description, ON resistance of the NMOS transistor N15 is assumed to be low enough.

With the NMOS transistor N11, the current iI of the input small signal is given by equation (2,1). With the NMOS transistor N13, the output current iob and the voltage Vob of the output small signal are obtained from equations (2,2) and (2,3), respectively.

$$-iI = g_{mpu11N}(Vob - VI) \tag{2,1}$$

$$iob = g_{mN} \cdot vI \tag{2,2}$$

$$vob = iob \cdot r \tag{2,3}$$

Using the above equations (2,1) to (2,3), an input impedance Zin and a current gain Ai of the current preamplifier PAMP10 of the first embodiment are given by the following equations (2,4) and (2,5), respectively.

$$Zin = vI/iI = 1/g_{mpu11N}(1 + r \cdot gmN) \tag{2,4}$$

$$Ai = iob/iI = g_{mN} \cdot Zin \tag{2,5}$$

It will be understood that the mutual conductance $g_{mN}$ of the NMOS transistors N13, N14 and the impedance r on the local data bus line LDB, LDBb are properly determined in the first embodiment by comparing the equation (2,4) with the equation (1,1) according to the conventional current preamplifier, so that the input impedance Zin of the current preamplifier PAMP10 can be reduced.

Accordingly, the current preamplifier PAMP10 of the first embodiment can make up a low input impedance circuit with a smaller sized elements than the conventional current preamplifier the input impedance of which is defined by only the capacity of the transistors for supplying current to the sub data bus line pair SDB, SDBb. On the contrary, the current gain Ai is defined, in the same manner as the conventional, by the input impedance Zin and the mutual conductance gmN of the NMOS transistors N13, N14 with the gates connected to the sub data bus lines SDB, SDBb.

(A-3) Effect

As described above, according to the current preamplifier of the first embodiment, the gates of the transistors for supplying current to the input terminals are coupled to the output terminals of the current preamplifier, so that a negative feedback is provided to the circuit (the current preamplifier), and so that a current preamplifier with low input impedance can be realized with a smaller circuit area than the conventional.

Although the current preamplifier of the first embodiment is a circuit with a negative feedback similar to the conventional current sensing amplifier that necessitates 12 MOS transistors, it can be realized with 5 transistors that is the same in number as a conventional current preamplifier with no negative feedback,, so that the current preamplifier of the first embodiment is effective for reduction in chip size.

Accordingly, the current preamplifier of the first embodiment allows a DRAM, which provides a large number of current preamplifiers between memory arrays, to accelerate its readout operation by reducing voltage amplitude of the data bus lines without a remarkable increase of the circuit area.

(B) Second Embodiment

Referring next to the drawing, a description will be made in detail to a data bus circuit according to a second embodiment of the present invention.

(B-1) Structure

Figure 5:
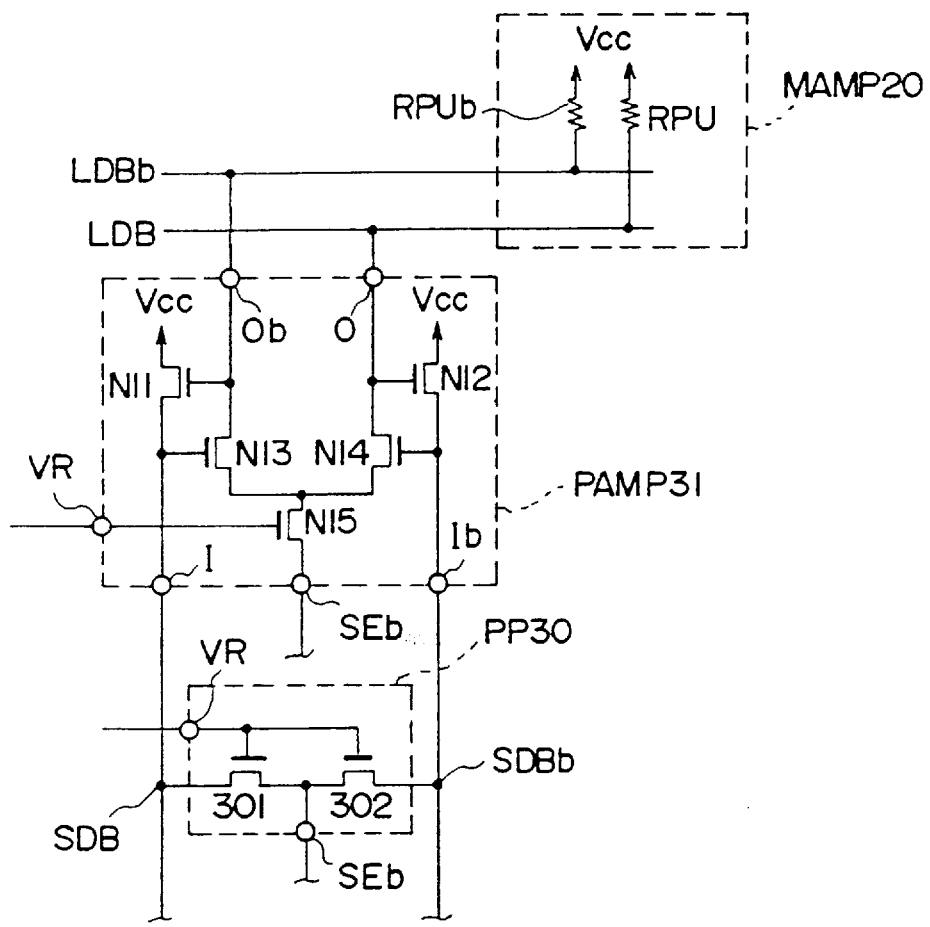
FIG. 5 is a circuit diagram showing part of a data bus circuit including a current preamplifier according to a second embodiment of the present invention.

FIG. 5 is a circuit diagram showing the main part of a data bus circuit with a current preamplifier PAMP31 according to the second embodiment. Portions common to those of the first embodiment are given the same reference numbers.

In the second embodiment, part of the current preamplifier PAMP10 of the first embodiment is modified. In other words, the current preamplifier PAMP31 is different from the current preamplifier PAMP10 of the first embodiment in that the gate of the NMOS transistor N15 is biased to a predetermined potential VR that lies between the ground potential and the power-supply voltage potential respectively applied to bias terminals, with the source thereof connected to a control line SEb.

Further, the second embodiment uses a level regulating circuit PP30 with NMOS transistors 301, 302 instead of the level regulating circuit PP11 because of such a difference between current preamplifiers, in which the gates of the NMOS transistors 301, 302 are biased to the predetermined potential VR, with the sources connected to the control line SEb and the drains connected to the sub data bus lines SDB, SDBb, respectively.

It should be noted that the predetermined potential VR is set to be intermediate between the ground potential and the power-supply potential so that the NMOS transistor with the gate biased to the predetermined potential VR can be operated in saturation.

(B-2) Operation

With the second embodiment, operation of the current preamplifier PAMP31 and the level regulating circuit PP30 is described but the description of the other circuitries is omitted.

The current preamplifier PAMP31 of the second embodiment is different from that of the first embodiment in that the control line SEb is kept at the H level higher than the bias voltage VR in the non-selected state. In this state, the NMOS transistor N15 turns off because the gate-to-source voltage thereof becomes negative, so that no output current flows from the current preamplifier. At this time, the NNOS transistors 301,, 302 in the level regulating circuit PP30 also turns off.

The sub data bus line pair SDB, SDBb connected to the input terminal pair I, Ib is then precharged to the H level. That is, since the local data bus line pair LDB, LDBb has been precharged to the H level by the pull-up elements RPU, RPUb in the main amplifier MANP20, the NMOS transistors N11, N12 turns on, thus precharging the sub data bus line pair SDB, SDBb.

Once the corresponding current preamplifier PAMP31 is selected, the control line SEb is changed to the L level. Consequently, the NMOS transistor N15 is biased into saturation because the gate-to-source voltage becomes VR-SEb, so that the NMOS transistor N15 acts as a current source. The NMOS transistors 301, 302 also act as current sources.

Accordingly, the current of a small signal passing through each output terminal Ob, O is in proportion to a potential difference of the input terminal pair I, lb. In other words, the differential amplifying operation of the NMOS transistors N13, N14 is performed based on the following equation (2,6) corresponding to the equation (2,2) of the first embodiment.

$$iob = gmN(vI-vIb) \qquad (2,6)$$

It should be noted that the NMOS transistors N11, N13 and the NMOS transistors N12, N14 provide negative feedback, as similar to the first embodiment, so that the current of the small signal passing through the output terminal pair Ob, O is stabilized against changes in current (potential) at the input terminal pair I, Ib. Thus, the gates of the NMOS transistors N11, N12 that supply current to the input terminals I, Ib are coupled to the output terminals Ob, O of the current preamplifier PAMP31, respectively, so that the input impedance can be reduced with a small occupied area in the same manner as the first embodiment, thereby accelerating the operation.

In the second embodiment, the intermediate potential VR applied to the gate of the NMOS transistor N15 that acts as the current source may be either kept constant, or changed according to the selected (L level) or non-selected (H level) state of the current preamplifier.

The level regulating circuit PP30 suppresses a potential rise on the sub data bus line pair SDB, SDBb by pulling in current from the sub data bus line pair when the current preamplifier PAMP31 has been selected, so that the NMOS transistors N11, N12 in the current preamplifier PAMP31 can be prevented from turning to be cut-off state.

(B-3) Effect

As described above, according to the current preamplifier of the second embodiment, the NMOS transistor N15 acts as a current source when the corresponding current preamplifier has been selected, so that the following effects are shown as well as the effects of the first embodiment.

Since the NMOS transistor N15 acts as the current source for differential amplifying operation, a stable current preamplifier with less error in operation can be obtained even if voltage noise of the sub data bus line pair SDB, SDBb, the power source Vcc or the ground line occurs.

The control of selecting or non-selecting the corresponding current preamplifier PAMP31 may be performed, for example, by driving a CMOS gate circuit to change over between two-value logic levels (H level and L level), so that the predetermined intermediate potential VR applied to the gate of the NMOS transistor N15 can be kept constant. Accordingly, the control circuit can be made simpler than a conventional control circuit, not cited as conventional example in the specification, the conventional control circuit controlling the transistor for the current source by changing over between the ground potential and a predetermined intermediate potential according to the selection and non-selection of the circuit (the current preamplifier).

The second embodiment also has the advantage of easily controlling the level regulating circuit PP30. Further, the current preamplifier PAMP31 and the level regulating circuit PP30 can use the same control circuit in common.

(C) Third Embodiment

Referring next to the drawing, a description will be made to a data bus circuit according to a third embodiment of the present invention.

Figure 6:
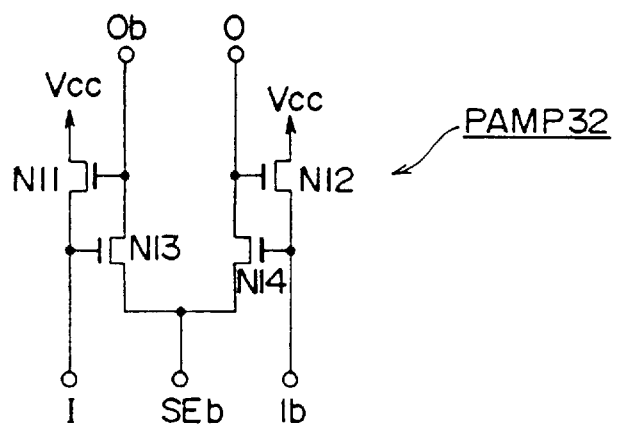
FIG. 6 is a circuit diagram showing a current preamplifier according to a third embodiment of the present invention.

FIG. 6 is a circuit diagram showing a current preamplifier PAMP32 according to the third embodiment. Portions common to those of the second embodiment are given the same reference numbers.

In the third embodiment, only the arrangement of the current preamplifier PAMP32 is different from the first embodiment. In other words, the NMOS transistor N15 in the current preamplifier PAMP10 of the first embodiment is eliminated and the sources of the NMOS transistors N13, N14 are directly connected to the control line SEb the L level of which exhibits the selected state of the corresponding current preamplifier.

In the current preamplifier PAMP32 of the third embodiment, the control line SEb is changed to the L level when the corresponding current amplifier PAMP32 has been selected. On the contrary, the control line SEb is kept at the H level during non-selected state.

Thus, the input impedance becomes low when the current preamplifier has been selected, as similar to the first embodiment, so that a high-speed current amplifying operation can be obtained. During non-selected state, the gate-to-source voltages of the NMOS transistors N13, N14 become negative since the sub data bus line pair SDB, SDBb is precharged, as discussed in the second embodiment, so that the NMOS transistors N13, N14 turn off and no output current flows.

According to the third embodiment, since the NMOS transistor N15 that acts as the current source in the second embodiment is eliminated, the differential amplifying operation is lowered, but the number of elements for the current preamplifier can be reduced, thereby making the circuit area small.

Further, according to the third embodiment, since the number of element stages connected in series to each other to act in saturation is reduced, an adequately large voltage can be applied to each element, and this is effective for low voltage operation.

(D) Fourth Embodiment

Referring next to the drawing, a description will be made a data bus circuit according to a fourth embodiment of the present invention.

(D-1) Structure

Figure 7:
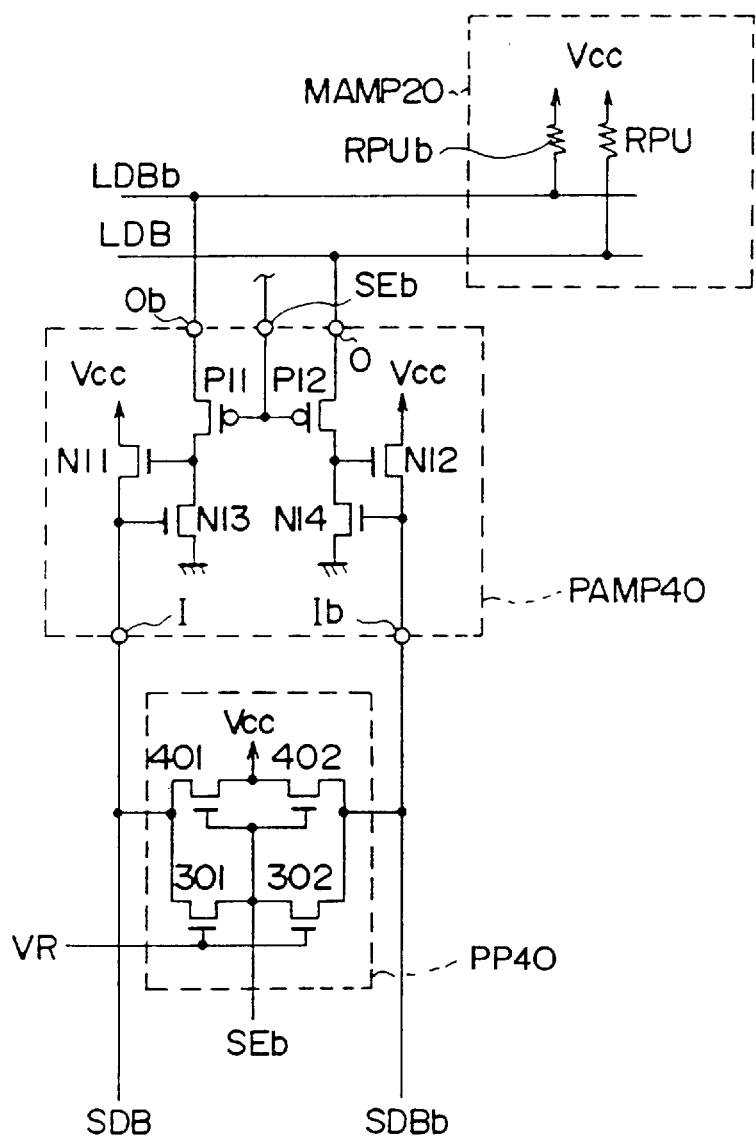
FIG. 7 is a circuit diagram showing part of a data bus circuit including a current preamplifier according to a fourth embodiment of the present invention.

FIG. 7 is a circuit diagram showing the main part of a current preamplifier PAMP40 according to the fourth embodiment. Portions common to those of the second embodiment in FIG. 5 are given the same reference numbers.

In the current preamplifier PAMP40 of the fourth embodiment, a pair of MOS transistors with a second conductivity type is connected in series, for turning on or off the output current of the current preamplifier PAMP40, between a pair of MOS transistors with a first conductivity type and the output terminal pair.

In FIG. 7, the current preamplifier PAMP40 includes a pair of input terminals I, Ib, a pair of output terminals O, Ob, four NMOS transistors N11–N14, and two PMOS transistors P11, P12.

The input terminal I is connected to the gate of the NMOS transistor N13 and to the source of the NMOS transistor N11. The drain of the NMOS transistor N13 is connected to the gate of the NMOS transistor N11 and to the drain of the PMOS transistor P11. The source of the PMOS transistor P11 is then connected to the output terminal Ob.

On the other hand, the input terminal Ib is connected to the gate of the NMOS transistor N14 and to the source of the NMOS transistor N12. The drain of the NMOS transistor N14 is connected to the gate of the NMOS transistor N12 and to the drain of the PMOS transistor P12. The source of the PMOS transistor P12 is then connected to the output terminal O.

The gates of the PMOS transistors P11, P12 are commonly connected to the control line SEb; the drains thereof are commonly connected to the power-supply voltage terminal Vcc.

In the fourth embodiment, a level regulating circuit PP40 connected to the sub data bus line pair SDB, SDBb includes not only the NMOS transistors 301, 302 that act as pull-down elements, but also NMOS transistors 401, 402 provided for precharging operation. The NMOS transistors 401, 402 are constituted such that the gates are commonly connected to the control line SEb, the drains are commonly connected to the power-supply voltage terminal Vcc, and the sources are connected to the sub data bus lines SDB, SDBb, respectively.

(D-2) Operation

In the current preamplifier PAMP40 of the fourth embodiment, the control line SEb is driven at the L level when the corresponding current preamplifier PAMP40 has been selected. Consequently, the PMOS transistors P11, P12 of the current preamplifier PAMP40 turn on and the gates of the NMOS transistors N11, N12 that supply current to the sub data bus line pair SDB, SDBb are electrically connected to the output terminals Ob, O, respectively.

Thus, a negative feedback is provided to the current preamplifier PAMP40 in the same manner as described in the first embodiment, so that the input impedance can be reduced, and so that high-speed amplifying operation can be obtained.

In the level regulating circuit PP40, only the NMOS transistor pair 301, 302 turns on to pull in current from the sub data bus line pair SDB, SDBb, so that the input impedance of the current preamplifier PAMP40 is prevented from increasing due to an excessive potential rise.

In the fourth embodiment, when the potential on the local data bus lines LDB, LDBb falls down excessively, each gate-to-source voltage of the PMOS transistors P12, P11 connected to the local data bus lines LDB, LDBb is reduced to make the conductance small, so that the potential drop on the local data bus lines can be prevented. On the contrary, when the potential on the local data bus lines LDB, LDBb rises, the conductance of the PMOS transistors P12, P11 becomes large, so that the potential rise on the local data bus lines can be prevented.

Thus, the voltage amplitude of the local data bus lines LDB, LDBb with large parasitic capacity is kept small by the PMOS transistors P12, P11 connected to the local data bus lines,, thereby accelerating continuous readout operation.

When the current preamplifier PAMP40 of the fourth embodiment has not been selected, the control line SEb is driven at the H level. In this state, the PMOS transistors P11, P12 turn off and no current flows into the output terminal pair O, Ob.

Consequently, in the level regulating circuit PP40,, the NMOS transistors 401, 402 with the gates connected to the control line SEb turn on, whereas the NMOS transistors 301, 302 with the gates biased to the predetermined potential VR (lower than the H level) turn off, so that the sub data bus line pair SDB, SDBb is precharged from the power-supply voltage Vcc to a potential reduced by a threshold voltage VtN of the NMOS transistors 401, 402.

It should be noted that the gates of the NMOS transistors N11, N12 become the ground potential since the NMOS transistors N13, N14 are on-state, so that the NMOS transistors N11, N12 turn to be off-state.

(D-4) Effect

As described above, according to the preamplifier of the fourth embodiment, high speed data transmission can be achieved by not only the effect of the reduction in input impedance as discussed in the first embodiment, but also reduction in voltage amplitude of the local data bus lines.

As similar to the conventional case or the first embodiment, the selected or non-selected state of the current preamplifier can be controlled by controlling logic levels applied to the gates of the MOS transistors, thus easily carrying out such control operation.

Further, the number of transistors needed for the current preamplifier of the fourth embodiment is six, so that the circuit (the current preamplifier) can be provided in a small space between the memory cell arrays.

(E) Fifth Embodiment

Referring next to the drawings, a description will be made to a data bus circuit according to a fifth embodiment of the present invention.

(E-1) Structure

Figure 8:
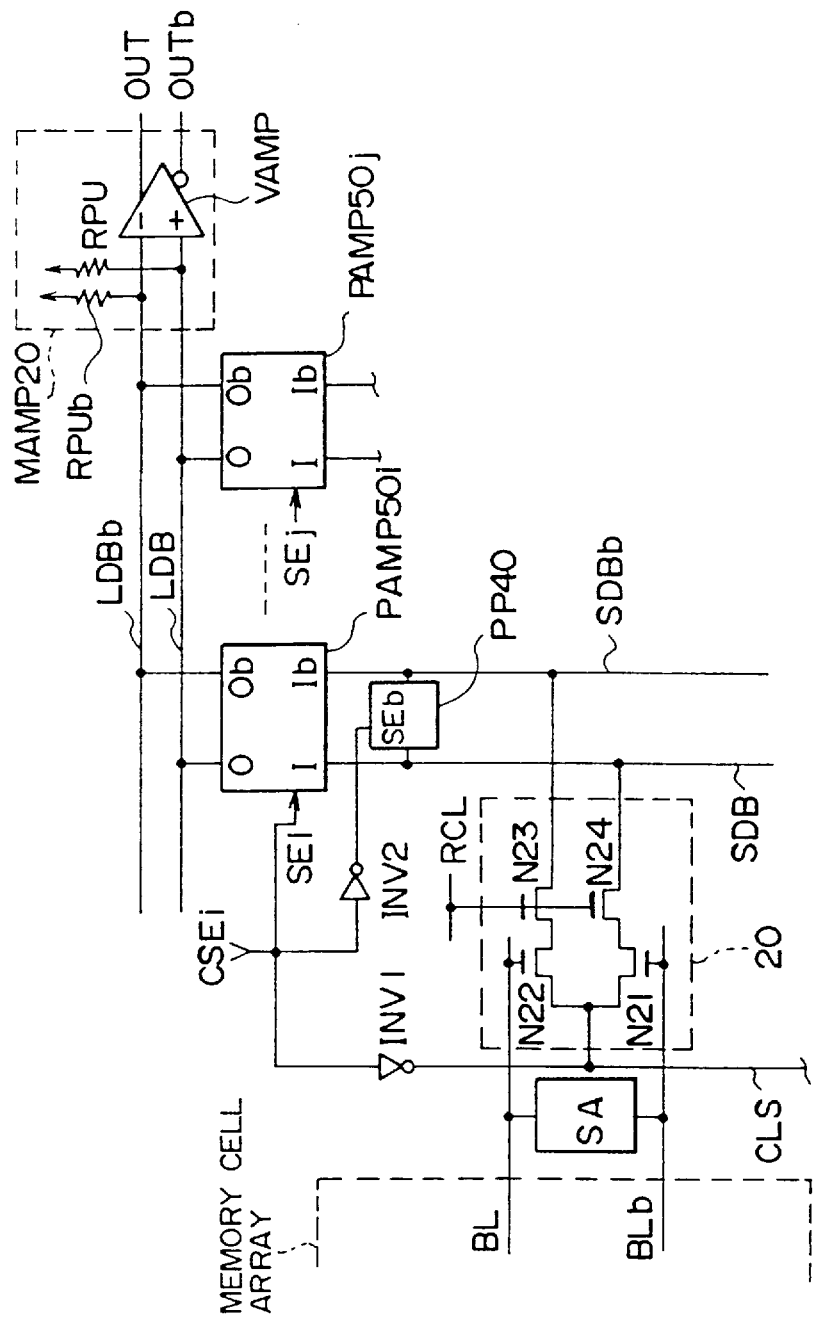
FIG. 8 is a block diagram showing a data bus circuit according to a fifth embodiment of the present invention.
Figure 9:
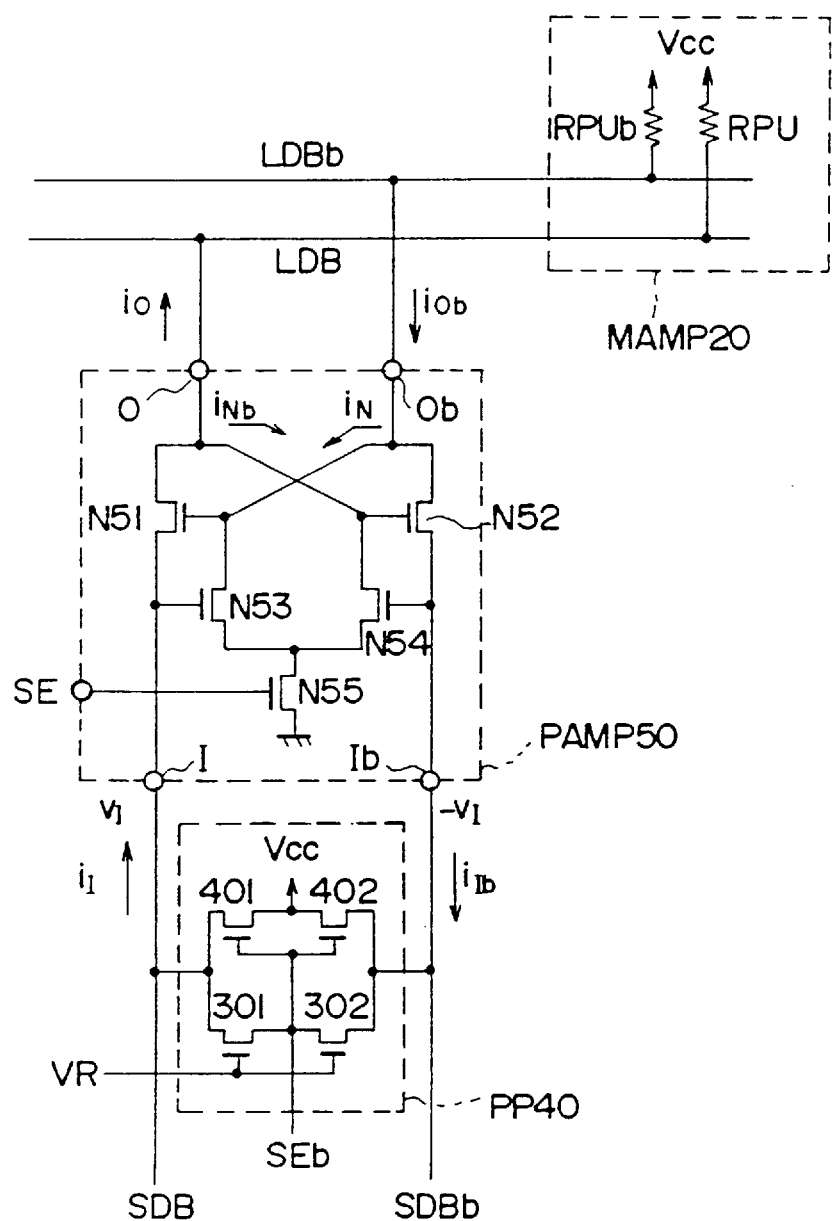
FIG. 9 is a circuit diagram showing part of the data bus circuit including a current preamplifier according to the fifth embodiment of the present invention.

FIG. 8 is a block diagram of the data bus circuit according to the fifth embodiment, showing a path from a memory cell array to a main amplifier. FIG. 9 is a circuit diagram showing an arrangement in the vicinity of a current preamplifier in FIG. 8.

Figure 2:
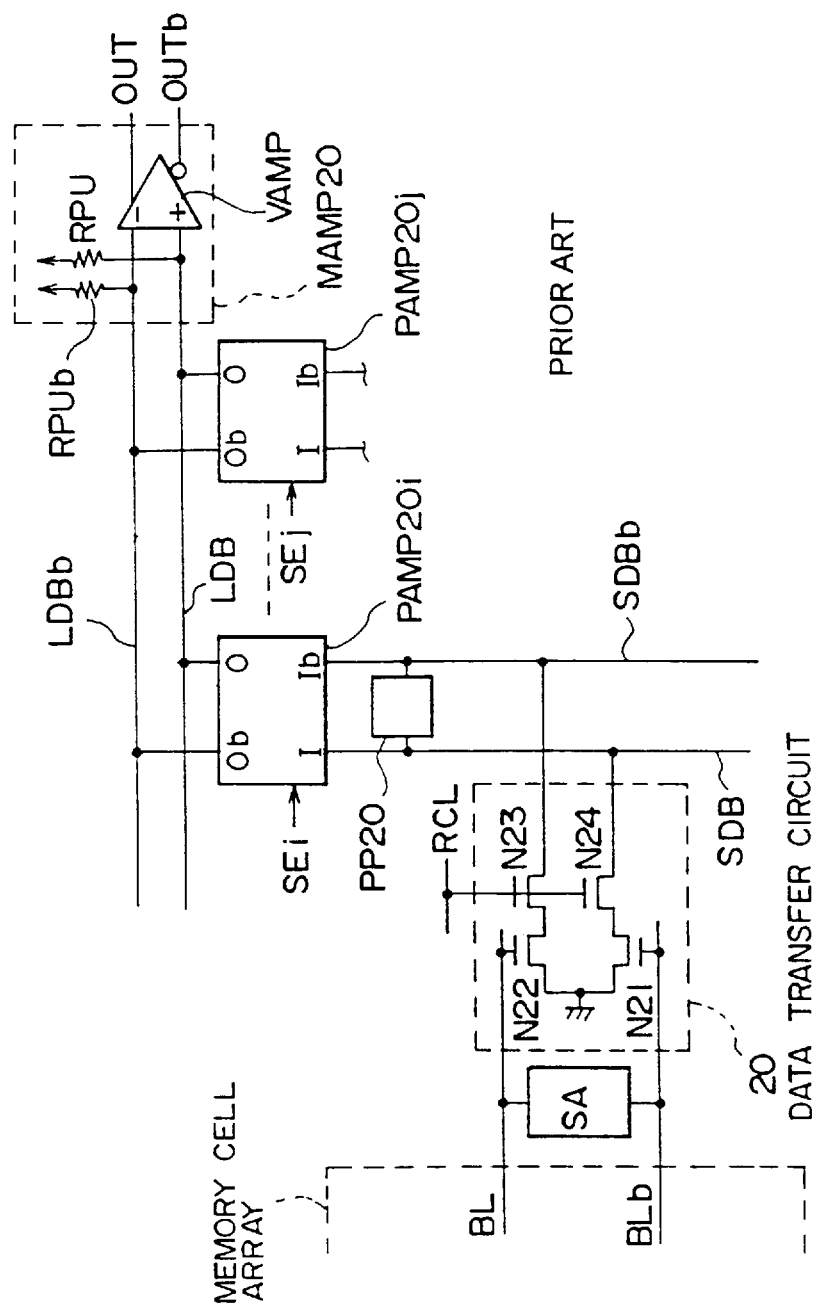
FIG. 2 is a block diagram showing a data transfer circuit and a main amplifier in the data bus circuit in FIG. 1.
Figure 3:
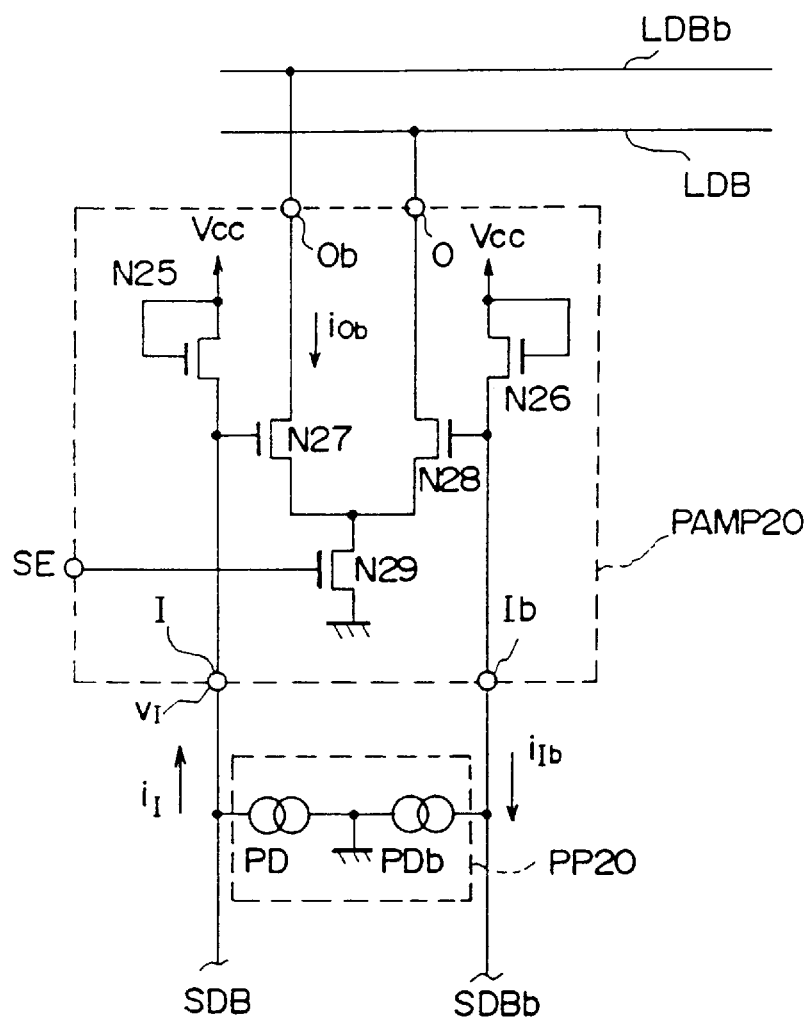
FIG. 3 is a circuit diagram showing a conventional current preamplifier.

The data bus circuit of the fifth embodiment is different from the data bus circuit in FIG. 2 in that (1) a current preamplifier PAMP50 (PAMP50i, PAMP50j, . . . ) shown in detail in FIG. 9 is used instead of the current preamplifier PAMP20 in FIG. 3, (2) the sources of the NMOS transistor pair N21, N22 in each data transfer circuit 20 are connected to a control line CLS, (3) the control line CLS is driven by an inverter INV1 to which a control signal is input from a control terminal CSEi provided for each current preamplifier PAMP50, and (4) this data bus circuit uses the level regulating circuit PP40 of the fourth embodiment in which the control signal is input from the control terminal CSEi to the level regulating circuit PP40 after inverted by an inverter INV2.

The current preamplifier PAMP50 different from the conventional and those of the above embodiments is shown below.

The most important feature of the current preamplifier PAMP50 of the fifth embodiment is a connecting structure of the NMOS transistor pair for supplying current to the input terminal pair with the drains connected to the output terminals, respectively.

In FIG. 9, the current preamplifier PAMP50 includes a pair of input terminal I, Ib, a pair of output terminal O, Ob, and five NMOS transistors N51–N55.

The input terminal I is connected to the gate of the NMOS transistor N53 and to the source of the NMOS transistor N51. The drain of the NMOS transistor N53 is connected to the gate of the NMOS transistor N51, the drain of the NMOS transistor N52 and the output terminal Ob.

The input terminal Ib is connected to the gate of the NMOS transistor N54 and to the source of the NMOS transistor N52. The drain of the NMOS transistor N54 is connected to the gate of the NMOS transistor N52, the drain of the NMOS transistor N51 and the output terminal O.

The sources of the NMOS transistors N53, N54 are connected to the drain of the NMOS transistor N55 with the gate connected to the control line SE.

Then, the level regulating circuit PP40 identical to that in the fourth embodiment is connected to the sub data bus line pair SDB, SDBb. In the data bus circuit, the local data bus line pair LDB, LDBb is biased to a high potential by the pull-up elements RPU, RPUb in the main amplifier MAMP20.

(E-2) Operation

At first, operation of the current preamplifier PAMP50 in the non-selected state is described with reference to FIG. 8.

In the non-selected state, the control terminal CSEi is kept at the L level, and the control line CLS to which the logic level is input through the inverter INV1 is driven at the H level. Consequently, no output current of the data transfer circuit 20 flows, i.e., no current flows into the data transfer circuit 20, so that the sub data bus line pair SDB, SDBb is precharged due to the operation of the level regulating circuit PP40 mentioned above in the fourth embodiment.

In other words, the NMOS transistors 401, 402 of the level regulating circuit PP40 turn on in the non-selected state since the control line SE of the level regulating circuit PP40 shown in detail in FIG. 9 is kept at the L level, so that the sub data bus line pair SDB, SDBb is precharged to a potential of Vcc–VtN, where vcc is a power-supply voltage and VtN is a threshold voltage of the NMOS transistor.

On the other hand, the local data bus line pair LDB, LDBb is precharged to a potential approximate to the power-supply voltage Vcc by the pull-up elements RPU, RPUb in the main amplifier MAMP20.

Accordingly, the gate-to-source voltage of the NMOS transistors N51, N52 in the current preamplifier PAMP50 becomes small so that the NMOS transistors N51, N52 are kept in the off-state. The NMOS transistor N55 also turns off since the L level at the control terminal CSEi is applied to the gate of the NMOS transistor N55 as it is, so that no current flows into the output terminals O, Ob of the current preamplifier PAMP50.

Next, operation of the current preamplifier PAMP50 in the selected state, i.e., when the control terminal CSEi is changed to the H level, is described.

Since the H level at the control terminal CSEi is inverted by the inverter INV1 into the L level, the data transfer circuit 20 is activated such that signal current flows into the sub data bus line pair SDB, SDBb.

At this time, since the L level inverted by the inverter INV1 from the H level at the control terminal is applied to the gates of the NMOS transistors 401, 402 in the level regulating circuit PP40 in FIG. 9, the gate-to-source voltage becomes negative, so that the NMOS transistors 401, 402 turn off. On the other hand, the NMOS transistors 301, 302 turn on since the L level smaller than the predetermined gate potential VR is applied to the sources thereof. Thus, the sub data bus line pair SDB, SDBb is regulated by pulling in current from the sub data bus line pair SDB, SDBb so that an excessive potential rise can not occur.

In the selected state, the current preamplifier PAMP50 act as described below. At first, a description will be made to a case that the current flown from the input terminal I is reduced so that the potential rises, and the current flown from the input terminal Ib is increased so that the potential drops.

At this time, the current passing through the NMOS transistor N51 is reduced, and the gate potential of the NMOS transistor N54 drops so that the current therethrough is reduced. Thus, the current frown from the output terminal O to the current preamplifier PAMP50 corresponding to the sum of the above currents is reduced. On the other hand, the current passing through the NMOS transistor N52 increases, and the gate potential of the NMOS transistor N53 rises so that the current therethrough increases. Thus, the current frown from the output terminal Ob to the current preamplifier 50 corresponding to the sum of the above currents is increased.

As such above, in the fifth embodiment, the output current is changed not only by an amount of current to be changed by the NMOS transistors N53, N54 with the gates connected to the input terminal pair I, Ib. but also by a changed amount of input current, thus obtaining a larger current gain than the first embodiment.

Further, since the gates of the NMOS transistors N51, N52 for supplying current to the input terminals I. Ib are coupled to the output terminals Ob, O, respectively, a negative feedback is provided to the current preamplifier PAMP50, as similar to the first embodiment, thus reducing the input impedance.

Next, characteristics of the current preamplifier PAMPSO in the fifth embodiment are described in detail by analyzing a small signal.

The voltage of the small signal at each terminal is set in the same manner as in the first embodiment so that a current of the small signal is defined as shown by the arrow in FIG. 9, where $g_{mpulIn}$ is a mutual conductance of the NMOS transistors N51, N52, $g_{mN}$ is a mutual conductance of the NMOS transistors N53, N54, and r is an impedance on the local data bus lines LDB, LDBb. In this analysis, ON resistance of the NMOS transistor N55 is assumed to be low enough.

With the output terminal O, the current iI of the input small signal is given by equation (3,1). With the NMOS transistor N54, the drain current iNb is given by equation (3,2). With the NMOS transistor N51 and the output terminal Ob, the voltage vob at the output terminal Ob and the current iI of the small signal are obtained from equations (3,3) and (3,4), respectively.

$$iI = io + iNb \quad (3,1)$$

$$iNb = g_{mN}(-vI) \quad (3,2)$$

$$vob = r \cdot iob = r \cdot io \quad (3,3)$$

$$-iI = g_{mpullN}(vob - vI) \quad (3,4)$$

Using the above equations (3,1) to (3,4), an input impedance Zin and a current gain Ai of the current preamplifier PAMP50 of the fifth embodiment can be obtained from the following equations (3,5) and (3,6), respectively.

$$Zin = v(1/g_{mpullN})\{(1 - r \cdot g_{mpullN})/(1 + r \cdot g_{mN})\} \quad (3,5)$$

$$Ai = 1 + g_{mN} \cdot Zin \quad (3,6)$$

It will be understood that the impedance r on the local data bus line pair LDB, LDBb and the mutual conductance $g_{mpullN}$ and $g_{mN}$ of respective NMOS transistors are properly determined by comparing the equation (3,5) with the equation (1,1) according to the conventional current preamplifier, so that the input impedance Zin of the current preamplifier PAMP50 of the fifth embodiment can be reduced. Accordingly, high-speed operation can be achieved.

It will be also understood that a current gain Ain larger than the conventional or the first embodiment can be obtained in the current preamplifier 50 of the fifth embodiment by comparing the equation (2,5) with the equation (1,2) for the current gain according to the conventional or the first embodiment.

The number of elements of the current preamplifier PAMP50 of the fifth embodiment is the same as in the first embodiment, i.e., five, so that the current preamplifier PAMP50 can be easily provided in a narrow space between the arrays with no extra circuit area required.

(E-3) Effect

As described above, according to the current preamplifier of the fifth embodiment,, the drains of the MOS transistor pair for supplying current to the input terminal pair are connected to the output terminals of the preamplifier, respectively, so that a current preamplifier having input impedance lower than the conventional can be realized with a small occupied area, thereby accelerating the data transmission on the sub data bus lines.

Further, the current gain can be made larger than that in the first embodiment, as discussed above, so that high-speed data transmission on the local data bus lines can be also obtained.

(F) Sixth Embodiment

Figure 10:
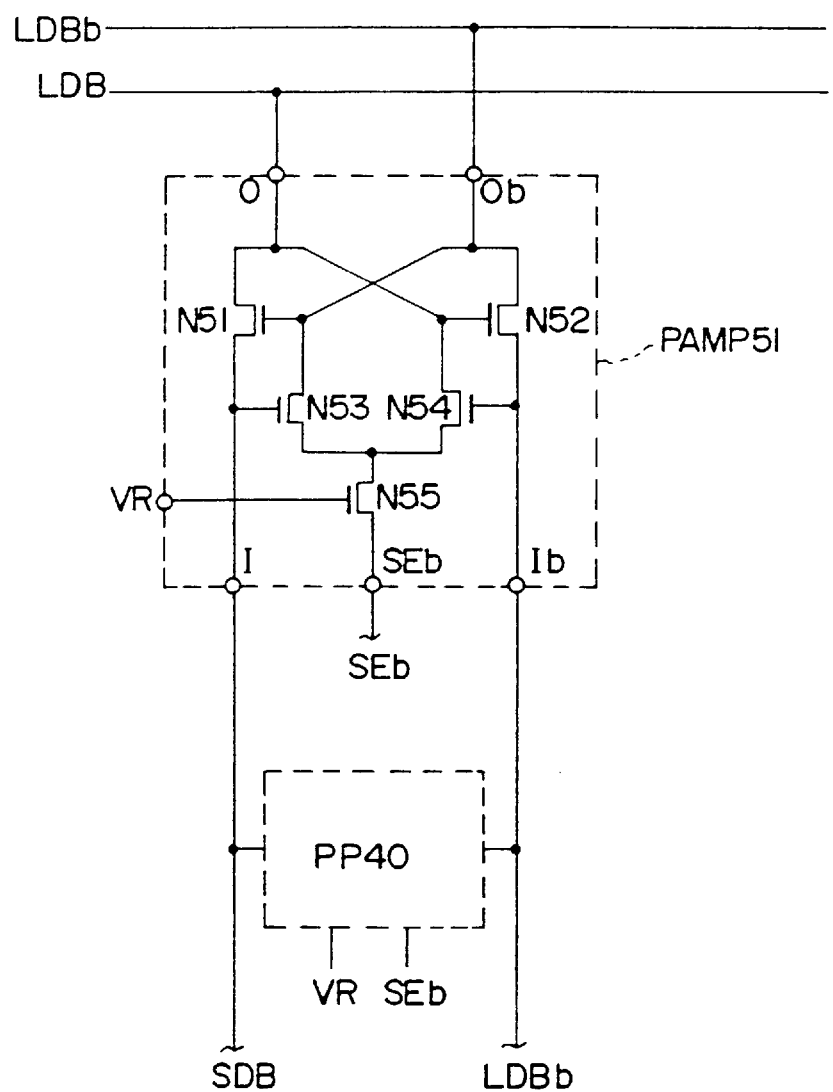
FIG. 10 is a circuit diagram showing a current preamplifier according to a sixth embodiment of the present invention.

Referring next to the drawing, a description will be made in detail to a data bus circuit according to a sixth embodiment of the present invention. FIG. 10 is a circuit diagram showing a structure of a current preamplifier PAMP51 according to the sixth embodiment. Portions common to those in FIG. 9 are given the same reference numbers.

The current preamplifier PAMP51 of the sixth embodiment is different from the current preamplifier PAMP50 in that the gate of the NMOS transistor N55 is biased to the predetermined potential VR that lies between the ground potential and the power-supply voltage potential, with the source of the NMOS transistor N55 connected to the control line SEb that takes the L level when the current preamplifier PAMP51 has been selected.

That is, as the first embodiment was modified into the second embodiment, the fifth embodiment is modified to build up the sixth embodiment.

The current preamplifier PAMP51 of the sixth embodiment becomes non-selected state when the control line SEb is at the H level, as similar to the second embodiment. At this time, the NMOS transistor N55 turns off and the sub data bus line pair SDB, SDBb is precharged to a potential of Vcc−VtN by the level regulating circuit PP40 so that the NMOS transistors N51, N52 turn off. Accordingly, no output current of the preamplifier PAMP51 flows.

On the other hand, when the control line SEb becomes the H level that exhibits the selected state, the predetermined potential VR set to be intermediate between the ground potential and the power-supply potential is applied to the gate of the NMOS N55 so that the NMOS transistor N55 acts as a current source in saturation. The level regulating circuit PP40 then pulls out current from the current preamplifier PAMP51. Thus, the current preamplifier PAMP51 can perform differential amplifying operation resistant to noise.

Further, the NMOS transistors N51, N52 with the gates controlled by potentials of the output terminals O, Ob supply current from the output terminals O, Ob to the input terminals I, Ib, as similar to the fifth embodiment, so that the input impedance can be reduced and the current gain is made large.

As described above, since the NMOS transistor N55 acts as a current source, the current preamplifier according to the sixth embodiment has the advantages of differential amplifying operation resistant to noise and easy control of selected or non-selected state as well as those in the fifth embodiment.

(G) Seventh Embodiment

Referring next to the drawing, a description will be made in detail to a data bus circuit according to a seventh embodiment of the present invention.

Figure 11:
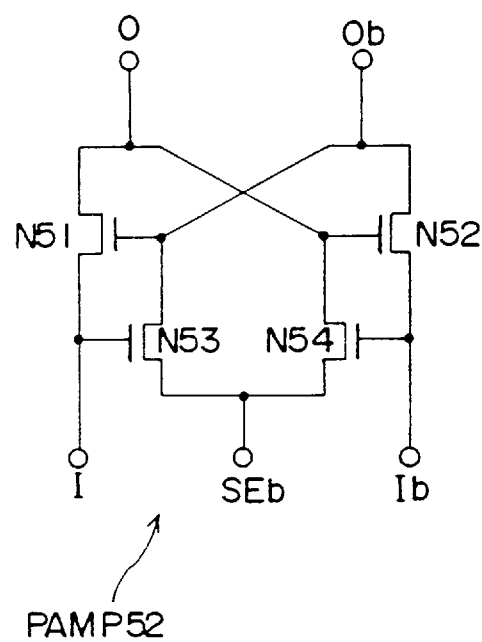
FIG. 11 is a circuit diagram showing a current preamplifier according to a seventh embodiment of the present invention.

FIG. 11 is a circuit diagram showing a current preamplifier PAMP52 according to the seventh embodiment. Portions common to those of the sixth embodiment are given the same reference numbers.

The seventh embodiment differs in structure of the current preamplifier PAMP52 from the fifth and sixth embodiments. In other words, the NMOS transistor N55 in the current preamplifier PAMP50 or PAMP51 of the fifth or sixth embodiment is eliminated and the sources of the NMOS transistors N53, N54 are directly connected to the control line SEb with the L level exhibiting the selected state of the corresponding preamplifier.

That is, the seventh embodiment is made up based on the fifth embodiment in the same manner that the third embodiment is made up by modifying the first embodiment.

In the current preamplifier PAMP52 of the seventh embodiment, the control line SEb is changed to the L level when the corresponding preamplifier PAMP52 has been selected. If the preamplifier PAMP52 has not been selected, the control line SEb is driven at the H level. In the selected state, the source voltage of the NMOS transistors N53, N54 become low so that the transistors turn on. The NMOS transistors N51, N52 also turn on since the sub data bus lines SDB, SDBb pull out current in accordance with the operation of the level regulating circuit PP40,,so that high-speed current amplifying operation can be performed with low input impedance and large current gain, as similar to the fifth and sixth embodiments.

In the non-selected state, the source potential of the NMOS transistors N53, N54 becomes high so that the transistors turn off. The source potential of the NMOS transistors N51, N52 also becomes high so that the transistors turn off since the sub data bus line pair SDB, SDBb is precharged by the level regulating circuit PP40. As a result, no output current flows.

According to the seventh embodiment, the current preamplifier has the effect of reduction in circuit area because the number of elements can be reduced as well as those of the fifth embodiment. Since the number of element stages connected in series between the output terminal and the ground line and operated in saturation is reduced, the current preamplifier of the seventh embodiment is effective for low voltage operation.

(H) Eighth Embodiment

Referring next to the drawing, a description will be made in detail to a data bus circuit according to an eighth embodiment of the present invention.

(H-1) Structure

Figure 12:
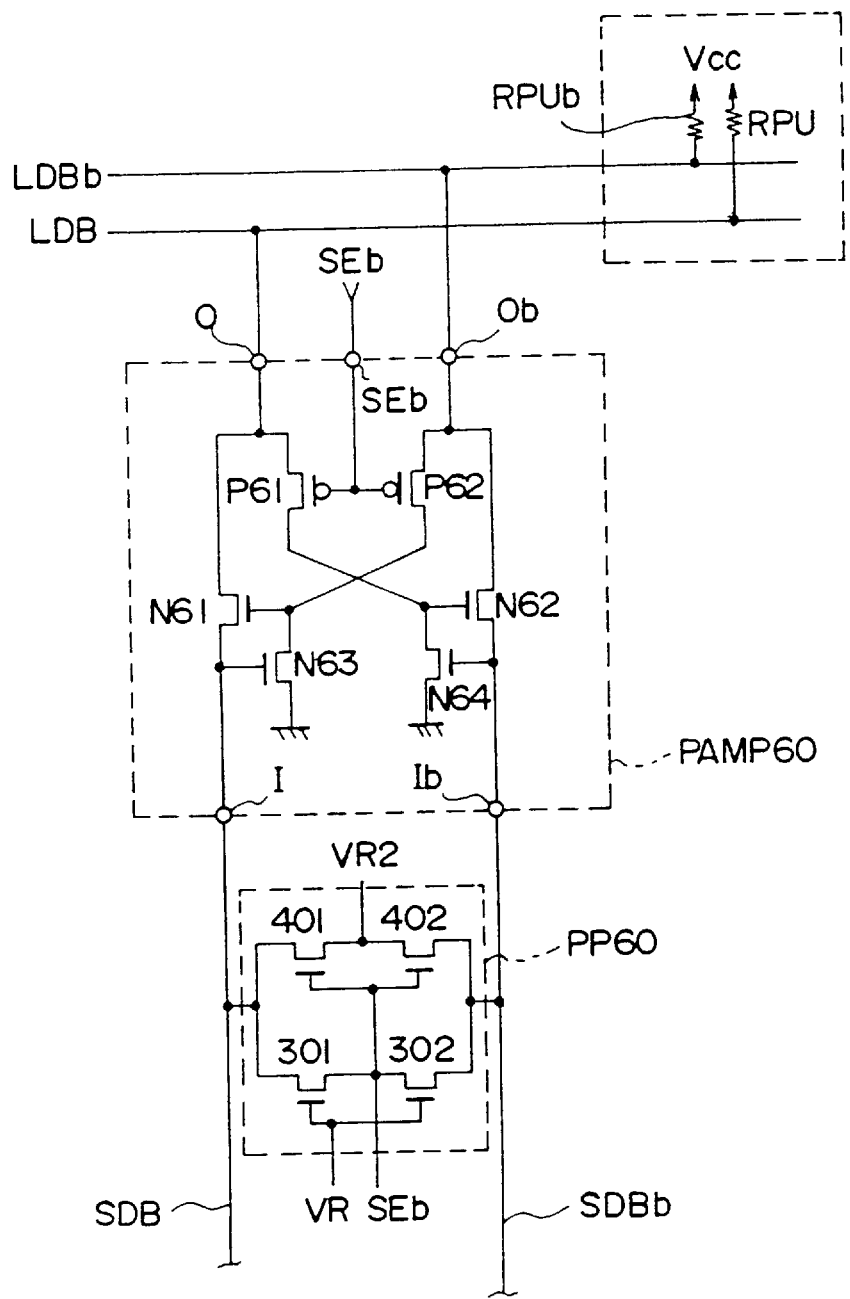
FIG. 12 is a circuit diagram showing part of a data bus circuit including a current preamplifier according to an eighth embodiment of the present invention.

FIG. 12 is a circuit diagram showing an arrangement of data bus lines with a current preamplifier PAMP60.

The current preamplifier PAMP60 of the eighth embodiment mainly features a pair of MOS transistors with a second conductivity type connected in series between the output terminal pair and the MOS transistor pair with a first conductivity type having the gate connected to the input terminal pair in the current preamplifier PAMP52 of the seventh embodiment, so that the output current can be turned on or off.

The current preamplifier PAMP60 of the eighth embodiment includes a pair of input terminals I, Ib, a pair of output terminals O, Ob, four NMOS transistors N61–N64 and two PMOS transistors P61, P62.

The input terminal I is connected to the gate of the NMOS transistor N63 and to the source of the NMOS transistor N61. The drain of the NMOS transistor N63 is connected to the gate of the NMOS transistor N61 and to the drain of the PMOS transistor P62 with the source connected to the drain of the NMOS transistor N62 and to the output terminal Ob.

On the other hand, the input terminal Ib is connected to the gate of the NMOS transistor N64 and to the source of the NMOS transistor N62. The drain of the NMOS transistor N64 is connected to the gate of the NMOS transistor N62 and to the drain of the PMOS transistor P61 with the source connected to the drain of the NMOS transistor N61 and to the output terminal O.

The gates of the PMOS transistors P61 and P62 are commonly connected to the control line SEb that takes the L level when the corresponding preamplifier PAMP60 has been selected.

In the eighth embodiment, a level regulating circuit PP60 is connected to the sub data bus line pair SDB, SDBb instead of the level regulating circuit PP40 of the fourth embodiment, in which the drains of the NMOS transistors 401, 402 are connected to a potential supply terminal for supplying a predetermined potential VR2 (Vcc in the fourth embodiment) higher than the threshold voltage VtN of the transistor.

(H-2) Operation

The current preamplifier of the eighth embodiment is in the non-selected state while the control line SEb holds the H level.

At this time, the sub data bus line pair SDB, SDBb is precharged to the potential VR2 (higher than VtN) by the level regulating circuit PP60, so that the NMOS transistors N63, N64 of the current preamplifier PAMP60 turn to be on-state.

On the other hand, the PMOS transistors P61, P62 turn off because the H level is applied to both the gates thereof, so that the NMOS transistors N61, N62 turn off. Thus, all the transistors P61, P62, N61 and N62 directly connected to the output terminals O, Ob turn to be off-state, so that no output current flows.

In the eighth embodiment, the NMOS transistors N63, N64 turn on as long as the potential on the sub data bus line pair SDB, SDBb is higher than the threshold voltage VtN of the transistor, differently from the fifth, sixth and seventh embodiments. Accordingly, the sub data bus line pairs SDB, SDBb connected to the non-selected preamplifiers PAMP60 may be precharged to a potential Vcc/2(=VR2).

When the corresponding current preamplifier PAMP60 of the eighth embodiment has been selected, the control line becomes the L level.

At this time, the L level is applied to the gates of the PMOS transistors P61, P62, so that the transistors turn to be on-state, and so that the NMOS transistors N61, N62 turn to be on-state as well. As a result, the corresponding preamplifier PAMP60 supplies current from the input terminal pair I, Ib to the sub data bus line pair SDB, SDBb so that the potential on the sub data bus line pair SDB, SDBb rises to the predetermined potential. Then, the data transfer circuit 50 shown in FIG. 8 sets up a current difference between the sub data bus lines SDB, SDBb, so that a potential difference corresponding to the current difference occurs across the input terminals I, Ib of the current preamplifier APMP60. The potential difference (current difference) is amplified by the W40S transistors N63, N64 in the current preamplifier PAMP60 in the same manner as in the fifth embodiment.

Since the PMOS transistor pair P61, P62 is on-state at this time, each gate of the NMOS transistor pair N61, N62 for supplying power to the input terminal pair I, Ib is electrically coupled to corresponding one of the output terminals O, Ob to provide a negative feedback, so that the input impedance is reduced. Each drain of the NMOS transistor pair N61, N62 is also connected to corresponding one of the output terminals O, Ob, so that a large current gain can be obtained in the same manner as in the fifth embodiment. Further, the PMOS transistor pair P61, P62 restrictively adjusts potential changes of the local data bus lines LDB, LDBb in the same manner as in the fourth embodiment, so that continuous data transmission on the local data bus lines LDB, LDBb can be accelerated.

(H-3) Effect

As described above, according to the current preamplifier of the eighth embodiment, the MOS transistor pair with the second conductivity type is connected in series between the output terminal pair and the MOS transistor pair with the first conductivity type having the gate connected to the input terminal pair, so that the output current of the preamplifier can be turn on or off. Accordingly, the following effects can be obtained as well as those of the fifth embodiment.

In the non-selected state of the preamplifier, the sub data bus line pair connected to the input terminal pair I, Ib has only to be precharged to the threshold voltage VtN of the transistor rather than such a voltage Vcc−VtN as is required in the fifth, sixth and seventh embodiments. Accordingly, the preamplifier of the eighth embodiment can be changed from the non-selected state to the selected state at a high speed by precharging a voltage Vcc/2 to the sub data bus lines. Further, the continuous data transmission on the local data bus lines can be accelerated in the same manner as in the fourth embodiment. Furthermore, the number of elements is reduced to six, so that the preamplifier can be realized with an adequately small circuit area.

(I) Ninth Embodiment

Referring next to the drawing, a description will be made in detain to a data bus circuit according to a ninth embodiment of the present invention.

(I-1) Structure

Figure 13:
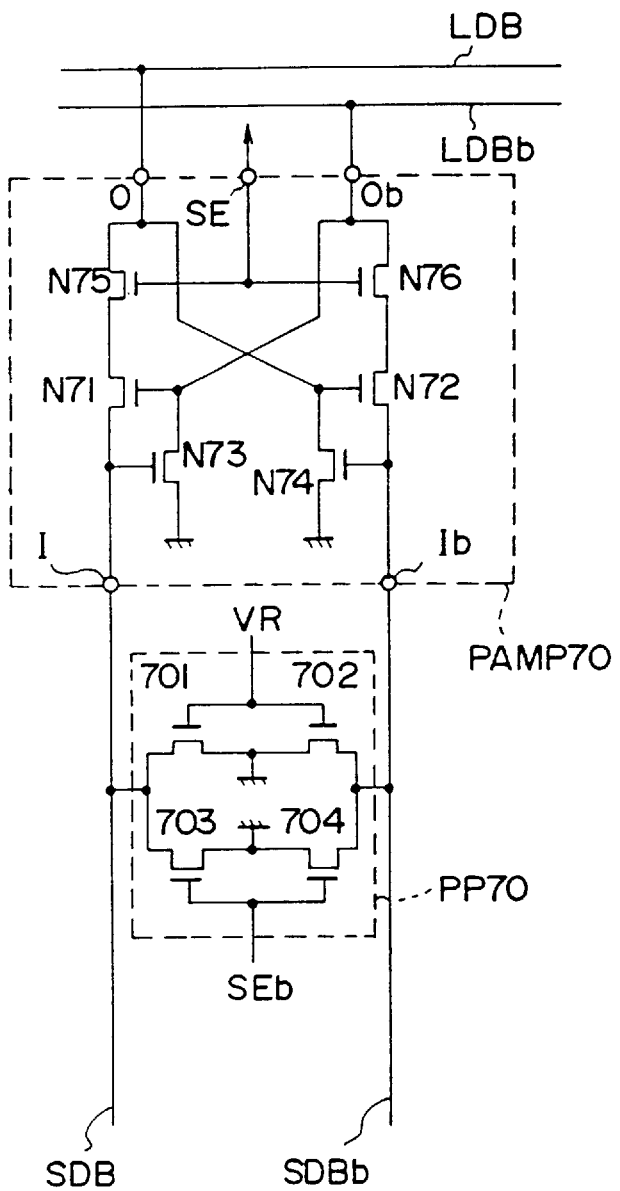
FIG. 13 is a circuit diagram showing part of a data bus circuit including a current preamplifier according to a ninth embodiment of the present invention.

FIG. 13 is a circuit diagram showing the data bus with a current preamplifier PAMP70 according to the ninth embodiment.

The current preamplifier PAMP70 of the ninth embodiment mainly features a pair of MOS transistors connected in series between the MOS transistor pair, each for supplying current to corresponding one of the input terminals, and the output terminal pair in the current preamplifier PAMP52 of the seventh embodiment,, so that the output current of the corresponding preamplifier can be turned on or off.

The current preamplifier PAMP70 of the ninth embodiment includes a pair of input terminals I, Ib, a pair of output terminals O, Ob and six NMOS transistors N71–N76.

The input terminal I is connected to the gate of the NMOS transistor N73 and to the source of the NMOS transistor N71. The drain of the NMOS transistor N73 is connected to the gate of the NMOS transistor N71 and to the output terminal Ob. The drain of the NMOS transistor N71 is connected to the source of the NMOS transistor N75 with the drain connected to the output terminal O.

On the other hand, the input terminal Ib is connected to the gate of the NMOS transistor N74 and to the source of the NMOS transistor N72. The drain of the NMOS transistor N74 is connected to the gate of the NMOS transistor N72 and to the output terminal O. The drain of the NMOS transistor N72 is connected to the source of the NMOS transistor N76 with the drain connected to the output terminal Ob.

The gates of the NMOS transistors N75 and N76 are commonly connected to the control line SE that takes the H level when the corresponding preamplifier PAMP70 has been selected.

In the ninth embodiment, a level regulating circuit PP70 is connected to the sub data bus line pair SDB, SDBb, for example, as follows: NMOS transistors 701, 703 are connected in series between the sub data bus line SDB and the ground line, and NMOS transistors 702, 704 are connected in series between the sub data bus line SDBb and the ground line, in which the gates of the NMOS transistors 701, 702 are biased to the predetermined potential VR and the gates of the NMOS transistors 703, 704 are commonly connected to the control line SEb that takes the L level when the corresponding preamplifier has been selected.

(I-2) Operation

The current preamplifier PAMP70 of the ninth embodiment is in the non-selected state while the control lines SE and SEb hold the L level and the H level, respectively.

At this time, the NMOS transistors N75, N76 in the current preamplifier PAMP70 turn off because the L level is applied to both the gates thereof. On the other hand, the NMOS transistors 703, 704 in the level regulating circuit PP70 turn on because the H level is applied to both the gates thereof, so that the sub data bus line pair SDB, SDBb is precharged to the L level. Thus, the transistors N73, N74 with the gates connected to the sub data bus line pair SDB, SDBb turn off because the L level on the sub data bus line pair SDB, SDBb is applied thereto.

Thus, all the transistors N73–N76 directly connected to the output terminal pair O, Ob turn to be off-state, so that the output current flow is stopped.

As such above, in current preamplifier PAMP70 of the ninth embodiment, the sub data bus line pair SDB, SDBb connected to the input terminal pair I, Ib is kept at the L level during the non-selected state of the corresponding preamplifier.

Accordingly, the data bus circuit with such current preamplifiers PAMP70 has only to control the corresponding readout column line RCL in the same manner as the data transfer circuit 20 according to the conventional data bus circuit shown in FIG. 2. In other words, the data bus circuit according to the ninth embodiment does not need to drive the control line CLS with a large load to which a large number of data transfer circuits 20 are commonly connected through the sources of the NMOS transistors N21, N22 in each data transfer circuit 20 with the gates connected to the bit line pair, as shown in FIG. 8.

On the other hand, the current preamplifier PAMP70 of the ninth embodiment becomes the selected state when the control lines SE, SEb are changed to the H level and the L level, respectively.

In the selected state, the NMOS transistors N75, N76 in the current preamplifier PAMP70 turn on because the H level is applied to the gates thereof. On the contrary, the NMOS transistors 703, 704 turn off because the L level is applied to the gates thereof. At this time, each local data bus line LDB, LDBb is at a high level close to the power-supply voltage vcc, as discussed with respect to FIG. 8, so that the NMOS transistors N71, N72 with the gates connected to the local data bus lines, respectively, turn to be on-state. Consequently, the potential of the sub data bus line pair SDB, SDBb rises and the NMOS transistors N73, N74 in the current preamplifier PAMP70 turn on. The NMOS transistors 701, 702 in the level regulating circuit PP70 pull in current from the sub data bus line pair SDB, SDBb in saturation, thus preventing an excessive potential rise of the sub data bus line pair SDB, SDBb.

At this time, since the data transfer circuit 20 shown in FIG. 8 pulls in current from the sub data bus line pair SDBI, SDBb, a given difference in current is produced between the sub data bus lines SDB, SDBb, so that a potential difference across the input terminals I, lb is produced in accordance with a difference in current amount to pass through each sub data bus line SDB, SDBb. The potential difference is then amplified by the NMOS transistors N73, N74 in the same manner as in the fifth embodiment. On the other hand, the NMOS transistor pair N71, N72 for supplying power to the input terminal pair I, lb is gate-controlled by the corresponding potential at the output terminal pair Ob, O to provide a negative feedback,, so that the input impedance is reduced. Further,, the NMOS transistor pair N71, N72 drives the output terminal pair O, Ob through the NMOS transistors 75, 76, so that a large current gain can be obtained.

(I-3) Effect

As described above, according to the current preamplifier and the level regulating circuit of the ninth embodiment, a large number of data transfer circuits in the data bus circuit do not need to be controlled at the same time since the sub data bus line pair connected to the input terminal pair is precharged to the H level in the non-selected state of the corresponding preamplifier. Accordingly, the data bus circuit of the ninth embodiment has the effect of reduction of time needed for changing over between the selected and non-selected states as well as effects of the fifth embodiment. Further, the number of elements is reduced to six, so that the preamplifier can be realized with an adequately small circuit area.

(J) Tenth Embodiment

Referring next to the drawings, a description will be made in detail to a data bus circuit according to a tenth embodiment of the present invention.

(J-1) Structure

Figure 14:
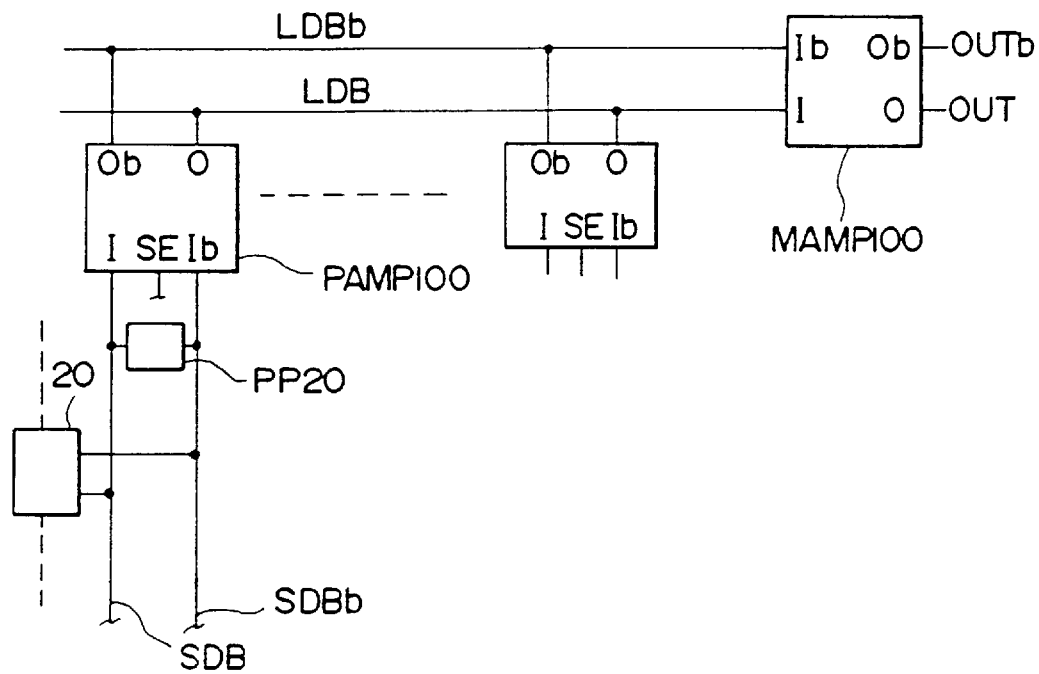
FIG. 14 is a block diagram showing a data bus circuit according to a tenth embodiment of the present invention.

FIG. 14 is a block diagram of an overall structure of the data bus circuit according to the tenth embodiment, showing a path from a memory cell array to a main amplifier.

The data bus circuit of the tenth embodiment is provided with preamplifiers PAMP10O each constituted with the same arrangement as any one of the current preamplifiers in the first to ninth embodiments instead of the current preamplifiers PAMP20 in the conventional data bus circuit in FIG. 2. It should be noted that, although the data transfer circuit and the level regulating circuit are given the same reference numbers as in FIG. 2, they may need to adopt arrangements different from the conventional properly depending on a structure of the current preamplifier to be used in this data bus circuit.

The data bus circuit of the tenth embodiment is also provided with a main amplifier MAMP100 of low input impedance type instead of the main amplifier MAMP20 provided with current-mirror type voltage amplifiers VAMP in the conventional data bus circuit in FIG. 2.

Figure 15:
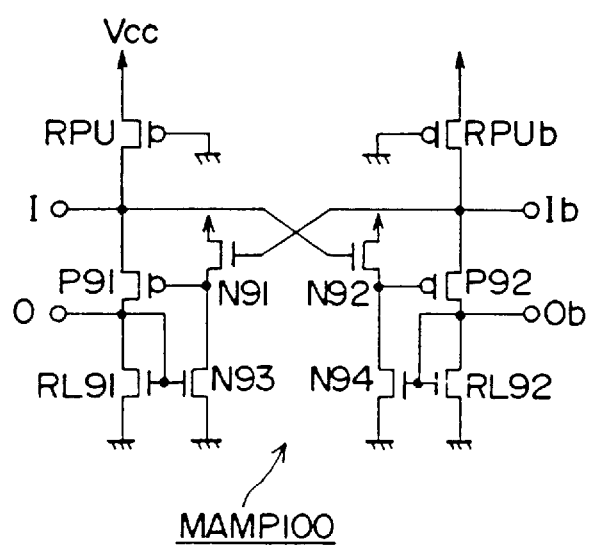
FIG. 15 is a circuit diagram showing a main amplifier according to the tenth embodiment of the present invention.

FIG. 15 is a circuit diagram showing details of the main amplifier MAMP100 of low input impedance type (see Japanese Patent Laid-Open Application No. 6-203561).

The main amplifier MAMP100, which includes six NMOS transistors N91–N94 and RL91, RL92 and four PMOS transistors P91, P92, RPU, RPUb, provides a positive feedback therein.

The drains of the PMOS transistors RPU, RPUb are connected to the respective input terminals (local data bus lines LDBb, LDB), with the sources connected to the power-supply voltage Vcc and the gates grounded.

The NMOS transistors RL91, RL92 act as loads, with the gates and the drains connected to the respective output terminals, and the sources grounded.

The sources of the PMOS transistors P91, P92 are connected to the respective input terminals I, Ib (local data bus lines LDBb, LDB), with the drains connected to the respective output terminals O, Ob. The gate of the PMOS transistor P91 is connected to the source of the NMOS transistor N91 and to the drain of the NMOS transistor N93, whereas the gate of the PMOS transistor 92 is connected to the source of the NMOS transistor N92 and to the drain of the NMOS transistor N94.

The drain of the NMOS transistor N91 is connected to the power-supply voltage Vcc, with the gate connected to the input terminal Ib (local data bus line LDB); the drain of the NMOS transistor N92 is connected to the power-supply voltage Vcc, with the gate connected to the input terminal I (local data bus line LDBb).

On the other hand, the drain of the NMOS transistor N93 is grounded, with the gate connected to the output terminal O; the drain of the NMOS transistor N94 is grounded, with the gate connected to the output terminal Ob.

That is, the main amplifier MAMP100 includes the PMOS transistor P91, which is connected to one local data bus line LDB (input terminal Ib) so that the conductance thereof is controlled by the potential on the other local data bus line LDBb (input terminal I), and the PMOS transistor P92, which is connected to one local data bus line LDBb so that the conductance thereof is controlled by the potential on the other local data bus line LDB.

(J-2) Operation

The logical operation of the data bus circuit in the tenth embodiment is essentially the same as the conventional. Therefore, only electrical characteristics are described below.

the description is made at first to the main amplifier MAMP100 of low input impedance type that replaces the conventional one.

In the main amplifier MAMP100, the NMOS transistors N91, N93 act as a level shifter for dropping the potential at the input terminal Ib by a predetermined amount. Similarly, the NMOS transistors N92, N94 act as a level shifter for dropping the potential at the input terminal I by the predetermined amount.

When the current flown from the input terminal I is reduced so that the potential rises, the gate-to-source voltage of the PMOS transistor P91 increases and the drain-to-source conductance thereof becomes large. Thus, the potential rise of the input terminal I can be prevented.

According to the main amplifier MAMP100, even if the level shift is transferred to the input terminal pair I, Ib (and hence to the local data bus line pair LDB, LDBb), the potential turns to be a predetermined level close to the pulled-up power-supply voltage Vcc, with the change made small by feedback operation. Further, potential changes accompanied with changes in current become small, so that low input impedance can be achieved. Since the changes of the input current results in changes in current passing through load resistors RL91, RL92 composed of the transistors in the amplifier, a large voltage signal can be obtained from the output terminal pair O, Ob.

The main amplifier MAMP100 of low input impedance type can be used as a receiver for the local data bus line pair LDB, LDBb to be biased to a level close to the power-supply voltage Vcc, so that an adequate voltage can be applied to the current preamplifiers PAMP100. This is effective for low power-supply voltage operation.

Next, the description is made to a unique operational characteristic obtained by combining the main amplifier MAMP100 of low input impedance type and the current preamplifiers PAMP100 each constituted with an arrangement according to any one of the first to ninth embodiments.

As discussed above, the input impedance of the main amplifier MAMP100 can be made-small enough. It is therefore considered that each impedance r of the local data bus lines LDB, LDBb seen from the output terminals O, ob of the current preamplifier PAMP100 is almost equal to that of the parasitic resistance on each local data bus line LDB, LDBb.

In the case the current preamplifier according to one of the first to fourth embodiments is used as the current preamplifier PAMP100, input impedance Zin and current gain Ai of such a current preamplifier are given by the equations (2,4) and (2,5), respectively, as described above.

Accordingly, large parasitic resistance on the local data bus line pair LDB, LDBb results in a small input impedance of the current preamplifiers PAMP100 connected to the local data bus line pair and then the current gain increases. In other words, the input impedance and the current gain of a current preamplifier PAMP100 connected at a distant end with the main amplifier PAMP100 is improved by an increase in impedance of the parasitic resistance on the local data bus lines compared with other current preamplifier PAMP100 connected at a near end.

Accordingly, the tenth embodiment can remarkably improve such variations in data transmission time as appears in the conventional depending on whether the selected current preamplifier PAMP20 is located at a near end or distant end.

Assuming next that the current preamplifier according to one of the fifth to ninth embodiments is used as the current preamplifier PAMP100, input impedance Zin and current gain Ai of the current preamplifier PAMP100 are given by the equations (3,5) and (3,6), respectively.

Accordingly, even if the current preamplifier according to one of the fifth to ninth embodiments is used as the current preamplifier PAMP100, a current preamplifier PAMP100 connected at a distant end with the main amplifier MAMP100 is improved more in input impedance and current gain than a current preamplifier PAMP100 connected at a near end with the main amplifier MAMP100, as similar to the case the current preamplifier according to one of the first to fourth embodiments is used for the tenth embodiment.

Accordingly, variations in data transmission time caused by a difference in physical position can be reduced.

(J-3) Effect

As described above, according to the tenth embodiment, the low input impedance type main amplifier is connected to the local data bus lines driven by the current preamplifiers the characteristic of which are controlled by feedback potential from the local data bus lines, so that high-speed data transmission can be realized irrespective of the physical position of the current preamplifier to be selected.

(K) Others (1) As discussed in the above embodiments, the current preamplifier and the data bus circuit of the present invention can be used, for example, as a readout data bus circuit in a DRM so that high-speed data transmission can be performed with a small circuit area. Also, the present invention can be applied to a high-speed SRAM data bus circuit by connecting the input terminal pairs of the current preamplifiers to bit line pairs of SRAM memory cells, respectively. Further, it can be applied to part of a data bus circuit in all kinds of logic circuits.

(2) Although the two-level data bus hierarchy with the sub data bus line and the local data bus line was taken by way of example to describe the present invention, the current preamplifier and the data bus circuit of the present invention can be effectively used in each level of a data bus hierarchy constituted with three levels or more. In consideration of this point, a term "current amplifier" is used instead of "current preamplifier" in the claims and the title of the present invention.

(3) It is possible in each embodiment to replace NMOS transistor by PMOS transistor, power-supply voltage by ground potential, and H level at the control terminal by L level.

(4) The MOS transistor may be replaced by a field effect transistor with other type having the same characteristics, such as MES, MIS or MNOS transistor.

(5) The power-supply voltage Vcc is not limited to an external power-supply voltage and a given potential produced within the LSI may be applied.

(6) In the tenth embodiment,, although the main amplifier MAMP100 is connected to the local data bus line pair, the present invention is not limited thereto, and current amplifier of various low input impedance types can be used, which includes a pair of MOS transistors connected to the local data bus lines, respectively, with the conductance controlled by the potential on each local data bus line.

As described in detail above, according to the first aspect of the present invention, since the current amplifier includes the first to fourth field effect transistors connected to provide a negative feedback, the input impedance of the current amplifier can be reduced with a smaller circuit area than the conventional, thereby accelerating operation of the data bus lines without a remarkable increase of the circuit area.

According to the second aspect of the present invention, since the current amplifier includes the first to fourth field effect transistors connected to provide a negative feedback, and the pair of field effect transistors for supplying current to the input terminal pair with the drains connected to the output terminals respectively, the current amplifier can be realized with a smaller occupied area having a lower impedance and a lager current gain than the conventional, thereby accelerating data transmission from input data bus lines to output data bus lines.

According to the third aspect of the present invention, the data bus circuit includes the plurality of first current amplifiers each using the pair of first data bus lines as its input line pair, part or all of which are connected to the pair of second data bus lines through their own output terminal pairs, and the second current amplifier using the pair of second data bus lines as its input line pair, in which the second current amplifier is constituted with a low input impedance circuit and the first current amplifier is constituted with an arrangement according to the first or second aspect of the present invention, so that high-speed data transmission between the first and second current amplifiers can be realized independently of the physical position of selected first current amplifier.

According to the fourth aspect of the present invention, the data bus circuit includes a level regulating circuit, connected to the input data bus line pair for the current amplifier, having the pair of field effect transistors with the gates biased to a predetermined potential and the sources controlled in accordance with the activated or deactivated state of the current amplifier, so that the logical level of the input data bus line pair for the current amplifier can be optimized in accordance with the activated or deactivated state of the current amplifier.

What is claimed is:

1. A current amplifier, comprising:

first and second field effect transistors respectively provided between a pair of input terminals and a first potential supply terminal; and third and fourth field effect transistors for supplying output power to a pair of output terminals;

the gate of said third field effect transistor being coupled to the first input terminal and to the source of said first field effect transistor, the gate of said first field effect transistor being coupled to the drain of said third field effect transistor; and the gate of said fourth field effect transistor being coupled to the second input terminal and to the source of said second field effect transistor, the gate of said second field effect transistor being coupled to the drain of said fourth field effect transistor.

2. The current amplifier as set forth in claim 1, further comprising a fifth field effect transistor for supplying predetermined current to the sources of said third and fourth field effect transistors when said current amplifier is activated.

3. The current amplifier as set forth in claim 1, wherein the sources of said third and fourth field effect transistors are commonly connected to a control line for controlling activation or deactivation of said current amplifier.

4. The current amplifier as set forth in claim 2, wherein the gate, the drain and the source of said fifth transistor are respectively connected to a control line for controlling activation or deactivation of said current amplifier, the sources of said third and fourth field effect transistors and a second potential supply terminal.

5. The current amplifier as set forth in claim 2, wherein the gate, the drain and the source of said fifth transistor are respectively coupled to a predetermined voltage line, the sources of said third and fourth field effect transistors and a control line for controlling activation or deactivation of said current amplifier.

6. The current amplifier as set forth in claim 1, further comprising fifth and sixth field effect transistors with a conductivity type different from that of said third and fourth field effect transistors, each for turning on or off output current passing through a corresponding one of said pair of output terminals, wherein the drain of said third field effect transistor is connected to the gate of said first field effect transistor and to the drain of said fifth field effect transistor, the drain of said fourth field effect transistor is connected to the gate of said second field effect transistor and to the drain of said sixth field effect transistor, the sources of said third and fourth field effect transistors are commonly connected to a second potential supply terminal, the sources of said fifth and sixth field effect transistors are connected to the first and second output terminals, and the gates of said fifth and sixth field effect transistors are commonly connected to a control line for controlling activation or deactivation of said current amplifier.

7. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 1.

8. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 2.

9. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 3.

10. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 4.

11. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 5.

12. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 6.

13. A data bus circuit comprising:

a current amplifier constituted with an arrangement as set forth in claim 1; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

14. A data bus circuit comprising:

a current amplifier constituted with an arrangement as set forth in claim 2; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

15. A data bus circuit comprising:

a current amplifier constituted with an arrangement as set forth in claim 3; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

16. A data bus circuit comprising:

a current amplifier constituted with an arrangement as set forth in claim 4; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

17. A data bus circuit comprising:

a current amplifier constituted with an arrangement as set forth in claim 5; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

18. A data bus circuit comprising:

a current amplifier constituted with an arrangement as set forth in claim 6; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

19. A current amplifier comprising:

first and second field effect transistors each for supplying current to a corresponding one of a pair of input terminals; and third and fourth field effect transistors with the gates connected to the pair of input terminals, respectively;

the drain of said third field effect transistor, the gate of said first field effect transistor and the drain of said second field effect transistor being coupled to a second output terminal;

the drain of said fourth field effect transistor, the gate of said second field effect transistor and the drain of said first field effect transistor being coupled to a first output terminal.

20. The current amplifier as set forth in claim 19, wherein the sources of said third and fourth field effect transistors are commonly connected to a control line for controlling activation or deactivation of said current amplifier.

21. The current amplifier as set forth in claim 19, further comprising a fifth field effect transistor for supplying predetermined current to the sources of said third and fourth field effect transistors when said current amplifier is activated.

22. The current amplifier as set forth in claim 21, wherein the gate, the drain and the source of said fifth transistor are respectively connected to a control line for controlling activation or deactivation of said current amplifier, the sources of said third and fourth field effect transistors and a second potential supply terminal.

23. The current amplifier as set forth in claim 21, wherein the gate, the drain and the source of said fifth transistor are respectively connected to a control line for controlling activation or deactivation of said current amplifier, the sources of said third and fourth field effect transistors and a second potential supply terminal.

24. The current amplifier as set forth in claim 21, wherein the gate, the drain and the source of said fifth transistor are respectively connected to a predetermined voltage line, the sources of said third and fourth field effect transistors and a control line for controlling activation or deactivation of said current amplifier.

25. The current amplifier as set forth in claim 19, further comprising fifth and sixth field effect transistors with a conductivity type different from that of said third and fourth field effect transistors, each for turning on or off output current passing through a corresponding one of said pair of output terminals, wherein the drain of said third field effect transistor is connected to the gate of said first field effect transistor and to the drain of said sixth field effect transistor, the drain of said fourth field effect transistor is connected to the gate of said second field effect transistor and to the drain of said fifth field effect transistor, the sources of said third and fourth field effect transistors are commonly connected to a second potential supply terminal, the source of said sixth field effect transistor is connected to the drain of said second field effect transistor and to the second output terminal, and the source of said fifth field effect transistor is connected to the drain of said first field effect transistor and to the first output terminal, and the gates of said fifth and sixth field effect transistors are commonly connected to a control line for controlling activation or deactivation of said current amplifier.

26. The current amplifier as set forth in claim 7, further comprising fifth and sixth field effect transistors, based on a control signal, for turning on or off output current of said current amplifier, wherein the drains of said first and second field effect transistors are connected to the sources of said fifth and sixth field effect transistors, respectively, the sources of said third and fourth transistors are commonly connected to a second potential supply terminal, the drain of said fifth field effect transistor is connected to the gate of said second field effect transistor, the drain of said fourth field effect transistor and the first output terminal, the drain of said sixth field effect transistor is connected to the gate of said first field effect transistor, the drain of said third field effect transistor and said second output terminal, and the gates of said fifth and sixth field effect transistors are commonly connected to a control line for controlling activation or deactivation of said current amplifier.

27. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 19.

28. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 20.

29. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 21.

30. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 22.

31. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 23.

32. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 24.

33. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 25.

34. A data bus circuit including a plurality of first current amplifiers each using a pair of first data bus lines as its input line pair, at least some of the plurality of first current amplifiers being connected to a pair of second data bus lines via output terminal pairs, and a second current amplifier using the pair of second data bus lines as its input line pair, wherein said second current amplifier is constituted with a low input impedance circuit having a pair of field effect transistors each connected to a corresponding one of said pair of second data bus lines so that the conductance thereof is controlled by the potential on the data bus line, and each of said first current amplifiers is a current amplifier as set forth in claim 7.

35. A data bus circuit comprising:

a current amplifier constituted with an arrangement as set forth in claim 19; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

36. A data bus circuit comprising:

a current amplifier constituted with an arrangement as set forth in claim 20; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

37. A data bus circuit comprising:

a current amplifier constituted with an arrangement as set forth in claim 21; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

38. A data bus circuit comprising:

a current amplifier constituted with an arrangement as set forth in claim 22; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

39. A data bus circuit comprising:

a current amplifier constituted with an arrangement as set forth in claim 23; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

40. A data bus circuit comprising:

a current amplifier constituted with an arrangement as set forth in claim 24; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

41. A data bus circuit comprising:

a current amplifier constituted with an arrangement as set forth in claim 25; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

42. A data bus circuit comprising:

a current amplifier constituted with an arrangement as set forth in claim 26; and a level regulating circuit connected to the current amplifier via a pair of input data bus lines to the current amplifier, wherein said level regulating circuit includes a pair of field effect transistors having gates biased to a predetermined potential and sources controlled in accordance with the activated or deactivated state of said current amplifier.

* * * * *